US012702063B2

(12) United States Patent
Kusunoki et al.

(10) Patent No.: US 12,702,063 B2
(45) Date of Patent: Aug. 4, 2026

(54) DISPLAY APPARATUS AND ELECTRONIC DEVICE

(71) Applicant: Semiconductor Energy Laboratory Co., Ltd., Atsugi (JP)

(72) Inventors: Koji Kusunoki, Isehara (JP); Daisuke Kubota, Atsugi (JP); Kazunori Watanabe, Machida (JP); Susumu Kawashima, Atsugi (JP); Satoshi Yoshimoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 602 days.

(21) Appl. No.: 17/927,387

(22) PCT Filed: Jun. 16, 2021

(86) PCT No.: PCT/IB2021/055291
§ 371 (c)(1),
(2) Date: Nov. 23, 2022

(87) PCT Pub. No.: WO2021/260493
PCT Pub. Date: Dec. 30, 2021

(65) Prior Publication Data
US 2023/0238369 A1 Jul. 27, 2023

(30) Foreign Application Priority Data
Jun. 26, 2020 (JP) ................................. 2020-110371

(51) Int. Cl.
*G06V 40/13* (2022.01)
*H10D 86/40* (2025.01)
(Continued)

(52) U.S. Cl.
CPC ........ *H10W 90/00* (2026.01); *G06V 40/1318* (2022.01); *H10D 86/423* (2025.01);
(Continued)

(58) Field of Classification Search
CPC . H10W 90/00; G06V 40/1318; H10D 86/423; H10D 86/60; H10H 20/857;
(Continued)

(56) References Cited

U.S. PATENT DOCUMENTS 8,421,775 B2 4/2013 Kim et al.
9,368,541 B2 6/2016 Kurokawa et al.
(Continued)

FOREIGN PATENT DOCUMENTS

CN 201383133 Y 1/2010
CN 111009556 A 4/2020
(Continued)

OTHER PUBLICATIONS

International Search Report (Application No. PCT/IB2021/055291) Dated Sep. 21, 2021.
(Continued)

*Primary Examiner* — Galina G Yushina
(74) *Attorney, Agent, or Firm* — Eric J. Robinson; Robinson Intellectual Property Law Office, P.C.

(57) ABSTRACT

A display apparatus having a noncontact input function is provided. The display apparatus has a first function of detecting, with a light-receiving device, light irradiated from a light source outside a display portion and blocked by a pointing object to recognize the position pointed by the pointing object, and a second function of detecting, with the light-receiving device, light irradiated from a light source inside or outside the display portion and reflected by the pointing object to recognize the position pointed by the pointing object. The display apparatus can operate by switching the first function and the second function in accordance with the intensity of the light irradiated from the light source outside the display portion.

12 Claims, 21 Drawing Sheets

(51) Int. Cl.

| | |
|---|---|
| *H10D 86/60* | (2025.01) |
| *H10H 20/857* | (2025.01) |
| *H10K 39/30* | (2026.01) |
| *H10K 59/65* | (2023.01) |
| *H10W 90/00* | (2026.01) |

(52) U.S. Cl.
CPC .......... *H10D 86/60* (2025.01); *H10H 20/857* (2025.01); *H10K 39/30* (2023.02); *H10K 59/65* (2023.02)

(58) Field of Classification Search
CPC ........ H10K 39/30; H10K 59/65; H10F 39/12; H10F 55/00; Y02E 10/549; G06F 3/042; G09F 9/00; G09F 9/30; G09F 9/33; H05B 33/02; H01L 25/167; H01L 25/0753; G10D 86/423
See application file for complete search history.

(56) References Cited

U.S. PATENT DOCUMENTS

| | | | |
|---|---|---|---|
| 9,450,133 | B2 | 9/2016 | Nakamura et al. |
| 9,639,211 | B2 | 5/2017 | Kurokawa et al. |
| 9,841,843 | B2 | 12/2017 | Kurokawa et al. |
| 10,126,933 | B2 | 11/2018 | Gomez |
| 10,853,587 | B2 | 12/2020 | Okamoto |
| 10,978,523 | B2 | 4/2021 | Park et al. |
| 12,096,659 | B2 | 9/2024 | Kamada et al. |
| 2006/0033016 | A1 | 2/2006 | Ogawa et al. |
| 2006/0145365 | A1 | 7/2006 | Halls et al. |
| 2008/0122803 | A1 | 5/2008 | Izadi et al. |
| 2010/0134735 | A1 | 6/2010 | Nakamura et al. |
| 2010/0141601 | A1 | 6/2010 | Kim et al. |
| 2011/0291989 | A1* | 12/2011 | Lee .......................... G06F 3/043 345/175 |
| 2012/0104381 | A1* | 5/2012 | Shieh ................. H10D 30/6755 257/43 |
| 2012/0105404 | A1 | 5/2012 | Gotoh et al. |
| 2012/0241768 | A1 | 9/2012 | Murai et al. |
| 2013/0299789 | A1 | 11/2013 | Yamazaki et al. |
| 2014/0056493 | A1 | 2/2014 | Gozzini |
| 2015/0293661 | A1* | 10/2015 | Gomez ................. G06F 3/0488 345/173 |
| 2017/0123542 | A1* | 5/2017 | Xie ..................... H10K 59/1213 |
| 2017/0357641 | A1 | 12/2017 | Okamoto |
| 2018/0018918 | A1* | 1/2018 | Miyake ................. G09G 3/3426 |
| 2020/0111851 | A1* | 4/2020 | Park ........................ H10K 39/32 |
| 2021/0257420 | A1 | 8/2021 | Park et al. |
| 2021/0374378 | A1 | 12/2021 | Kobayashi et al. |
| 2024/0397755 | A1 | 11/2024 | Kamada et al. |

FOREIGN PATENT DOCUMENTS

| | | | | |
|---|---|---|---|---|
| EP | 2182427 | A | 5/2010 | |
| EP | 3637472 | A | 4/2020 | |
| JP | 2006-079589 | A | 3/2006 | |
| JP | 2007-183706 | A | 7/2007 | |
| JP | 2007183706 | | * 7/2007 | ............ G06F 3/041 |
| JP | 2012-256020 | A | 12/2012 | |
| JP | 2014-197522 | A | 10/2014 | |
| JP | 2016-503529 | | 2/2016 | |
| JP | 2017-224294 | A | 12/2017 | |
| JP | 2020-092080 | A | 6/2020 | |
| KR | 2008-0048736 | A | 6/2008 | |
| KR | 2010-0042900 | A | 4/2010 | |
| KR | 2010-0061393 | A | 6/2010 | |
| KR | 2010-0066838 | A | 6/2010 | |
| KR | 2017-0140071 | A | 12/2017 | |
| KR | 20190026226 | | * 3/2019 | ............ H01L 51/05 |
| KR | 2020-0040196 | A | 4/2020 | |
| TW | 201631365 | | 9/2016 | |
| WO | WO-2011/055638 | | 5/2011 | |
| WO | WO-2014/060693 | | 4/2014 | |
| WO | WO-2020/053692 | | 3/2020 | |

OTHER PUBLICATIONS

Written Opinion (Application No. PCT/IB2021/055291) Dated Sep. 21, 2021.
Taiwanese Office Action (Application No. 110120831) Dated Oct. 28, 2024.

\* cited by examiner

| 12 | 11 | 13 |

| 11 | 12 | 13 |

| 11 | 13 |
| 12 | |

| 11 | 12 |
| 13 | |

| 11 | 12 |

| 11 | 13 |

| 11 |

| 11R | 11G | 11B |

| 11R | 11G | 11B | 11W |

149   22   152   21   142   148

115

214

151

110 113 112 111   41   216   191 193 190 114   42

149   22   152   21   142   148

195

115

214

151

110 113 112 111   41   216   191 193 190 114   42

50B 149   23d   154   23c   142   148

195
115
214
212
155
153

110 113 112 111   41   217   191 193 190 114   42

50C 149   22   184 152   21   142   148

195
115
214
151

110 113 112 111   41   216   191 193 190 194   42

50D 149        22        184 152        21        142        148

195
115

214
151

110 113 182 111        41        216        191 192 193 114 190 42

50E 149        22        184 152        21        142        148

195
115

214
151

110 113 182 111        41        216        191 192 193 194 190 42

100C

PIX1

PIX2

PIX2

PIX3

DISPLAY APPARATUS AND ELECTRONIC DEVICE

TECHNICAL FIELD

One embodiment of the present invention relates to a display apparatus.

Note that one embodiment of the present invention is not limited to the above technical field. Examples of the technical field of one embodiment of the present invention include a semiconductor device, a display apparatus, a light-emitting apparatus, a power storage device, a memory device, a lighting device, an input device (e.g., a touch sensor), an input/output device (e.g., a touch panel), an electronic device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an image capturing device, or an electronic device includes a semiconductor device.

BACKGROUND ART

In recent years, display apparatuses have been applied to various use. Examples of applications of large-sized display apparatuses are television devices for home, digital signage, PID (Public Information Display), and the like. Examples of applications of small- and medium-sized display apparatuses are portable information terminals such as smartphones and tablet terminals.

For example, light-emitting apparatuses including light-emitting devices have been developed as display apparatuses. Light-emitting devices utilizing an electroluminescence (hereinafter referred to as EL) phenomenon have features such as thinness, small weight, high-speed response, and capability of low-voltage driving. Patent Document 1, for example, discloses a flexible light-emitting apparatus.

REFERENCE

Patent Document

[Patent Document 1] Japanese Published Patent Application No. 2014-197522

SUMMARY OF THE INVENTION

Problems to be Solved by the Invention

Since electronic devices that include display apparatuses are used for a variety of applications as described above, they are desired to have higher functionality. For example, a more convenient electronic device can be achieved with a user interface function, an image capturing function, or the like. As a user interface, an input function such as a touch panel is often used.

A touch panel can be operated with a part of the body such as a finger touching the panel surface, which is a useful function. However, a touch panel cannot be operated when at a position that cannot be physically touched. A touch panel also has a problem of insufficient hygiene control of the panel surface (e.g., attachment of dust, bacteria, or viruses).

In view of the above, an object of one embodiment of the present invention is to provide an electronic device having a noncontact input function. Another object is to provide an electronic device having a function of detecting light. Another object is to provide a novel electronic device. Another object is to provide a novel semiconductor device or the like.

Note that the description of these objects does not preclude the existence of other objects. One embodiment of the present invention does not have to achieve all the objects. Other objects are apparent from and can be derived from the description of the specification, the drawings, the claims, and the like.

Means for Solving the Problems

Embodiments of the present invention are a display apparatus that includes a light-receiving device in a display portion and an electronic device that includes the display apparatus.

One embodiment of the present invention is a display apparatus in which a plurality of light-emitting devices and a plurality of light-receiving devices are provided in a display portion. When a pointing object is over the display portion, the display apparatus has a first function of irradiating no light from the light-emitting device and detecting, with the light-receiving device, light attenuated by being blocked by the pointing object to recognize the position pointed by the pointing object, and a second function of irradiating light from the light-emitting device and detecting, with the light-receiving device, light reflected by the pointing object to recognize the position pointed by the pointing object.

The display apparatus can operate by switching the first function and the second function in accordance with the intensity of light detected with the light-receiving device when the light-emitting device irradiates no light.

The light irradiated from the light-emitting device can be infrared light.

In the first function of the display apparatus, a second region that is surrounded by a first region provided with the light-receiving device detecting light with intensity higher than or equal to first intensity and that is provided with the light-receiving device detecting light with intensity lower than the first intensity and the vicinity of the second region can be recognized as the position pointed by the pointing object.

In the second function of the display apparatus, a fourth region that is surrounded by a third region provided with the light-receiving device detecting light with intensity lower than or equal to second intensity and that is provided with the light-receiving device detecting light with intensity higher than the second intensity and the vicinity of the fourth region can be recognized as the position pointed by the pointing object.

It is preferable that the light-receiving device include a photoelectric conversion layer and include an organic compound in the photoelectric conversion layer.

The display portion can include a display device, and the display device can emit any of red light, green light, blue light, and white light.

In the second function, the light detection operation by the light-receiving device is preferably performed when the display device performs non-light-emitting operation.

The display device and the light-receiving device can each have a diode structure, and a cathode of the display device and an anode of the light-receiving device can be electrically connected to each other. Alternatively, the cathode of the display device and a cathode of the light-receiving device can be electrically connected to each other.

It is preferable that the display device and the light-receiving device be electrically connected to a plurality of transistors, one or more of the plurality of transistors include a metal oxide in a channel formation region, and the metal oxide include In, Zn, and M (M is Al, Ti, Ga, Ge, Sn, Y, Zr, La, Ce, Nd, or Hf).

The position pointed by the pointing object can be recognized even when the pointing object is at a position not in contact with the display portion.

Another embodiment of the present invention is an electronic device that includes the above display apparatus and an optical sensor and that switches operation for detecting the position pointed by a pointing object in accordance with the intensity of light detected by the optical sensor.

Effect of the Invention

According to one embodiment of the present invention, a display apparatus having a noncontact input function can be provided. Alternatively, a display apparatus having a function of detecting light can be provided. Alternatively, a novel display apparatus can be provided. A novel semiconductor device or the like can be provided.

Note that the description of the effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 6A to FIG. 6K are diagrams each illustrating subpixels.

MODE FOR CARRYING OUT THE INVENTION

Figure 1:
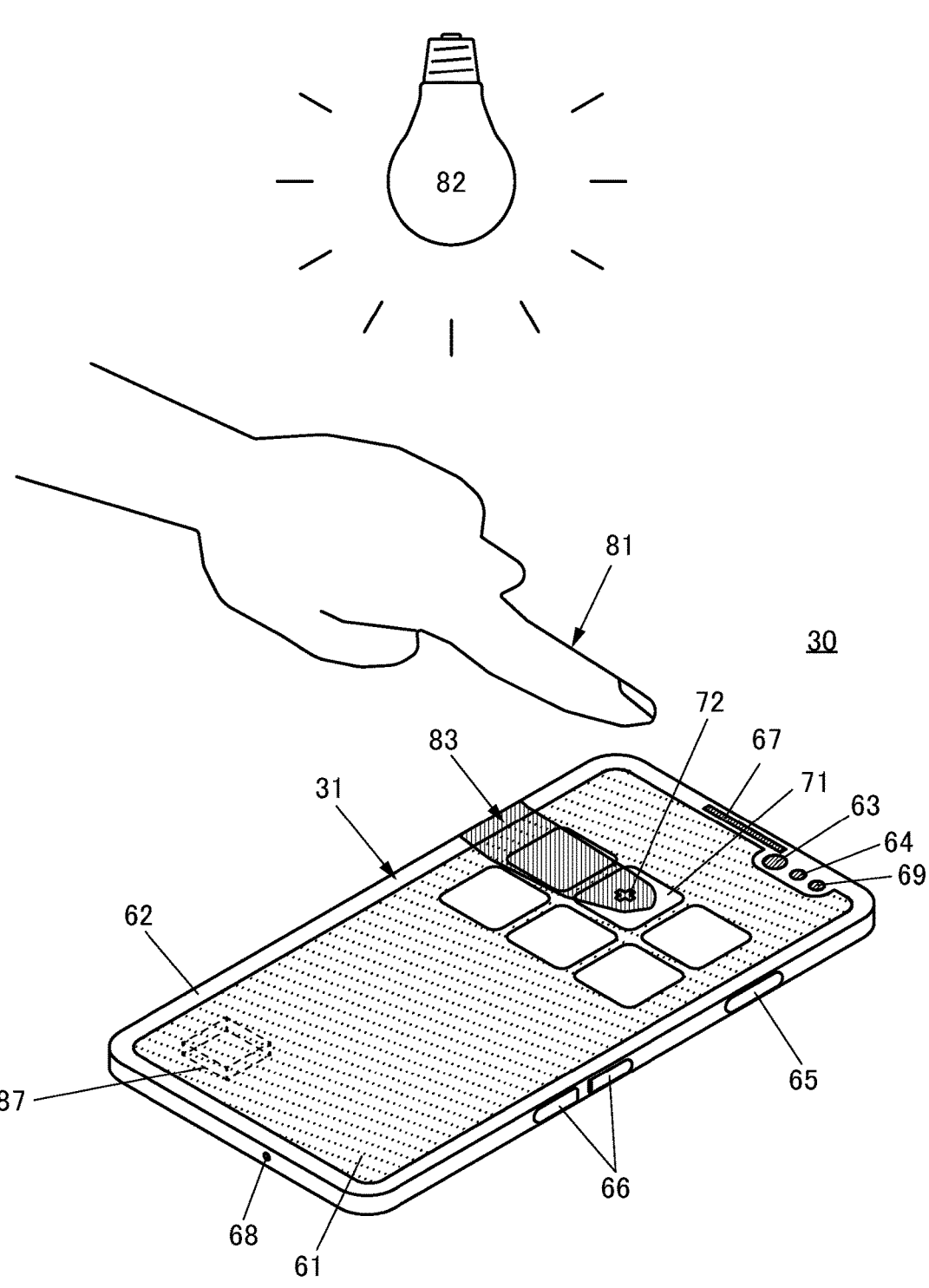
FIG. 1 is a diagram illustrating an electronic device.

Embodiments are described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as switches may be connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one or more conductors; in this specification, even such a structure is included in direct connection.

Embodiment 1

In this embodiment, display apparatuses of embodiments of the present invention will be described.

One embodiment of the present invention is a display apparatus that can perform an input operation with or without contact. The display apparatus includes, in a display portion, a display device (also referred to as a display element), a light-emitting device (also referred to as a light-emitting element), and a light-receiving device (also referred to as a light-receiving element).

The display apparatus has a first function of detecting, with the light-receiving device, the light irradiated from a light source outside the display portion and blocked by a pointing object to recognize the position pointed by the pointing object. The display apparatus has a second function of detecting, with the light-receiving device, the light irradiated from a light source inside or outside the display portion and reflected by a pointing object to recognize the position pointed by the pointing object.

The display apparatus can operate by switching the first function and the second function in accordance with the intensity of the light irradiated from the light source outside the display portion. That is, the position pointed by the pointing object over the display portion can be recognized irrespective of the ambient illuminance.

FIG. 1 is a diagram illustrating an electronic device 30 including the display apparatus of one embodiment of the present invention.

FIG. 1 shows a smartphone as an example of the electronic device 30; however, there is no particular limitation on the functions of the electronic device 30, examples of which include a digital camera, a digital video camera, a digital photo frame, a portable game console, a portable information terminal, and an audio reproducing device in addition to electronic devices with a relatively large screen, such as a television device, a desktop or laptop computer, a tablet computer, a monitor of a computer or the like, digital signage, and a large game machine such as a pachinko machine.

The electronic device 30 may include a sensor (a sensor having a function of detecting force, displacement, position, speed, acceleration, angular velocity, rotational frequency, distance, light, liquid, geomagnetism, temperature, a chemical substance, sound, time, hardness, electric field, current, voltage, electric power, radiation, flow rate, humidity, gradient, oscillation, a smell, or infrared rays).

By using any of these sensors, the input function of the display apparatus of one embodiment of the present invention can be switched and correction or the like can be performed. For example, the input method of the display apparatus can be switched in accordance with a change in the illuminance detected by an optical sensor of the electronic device 30. Furthermore, correction of input or the like can be performed by detecting the angle and orientation of the display apparatus with the use of an inclination sensor 87 (e.g., a combination of an acceleration sensor, a geomagnetic sensor, a gyroscope sensor, and the like) of the electronic device 30.

The electronic device 30 can have a variety of functions. For example, the electronic device 30 can have a function of displaying a variety of information (a still image, a moving image, a text image, and the like) on the display portion, a function of displaying a calendar, date, time, or the like, a function of executing a variety of software (programs), a wireless communication function, and a function of reading a program or data stored in a recording medium.

The electronic device 30 includes a display portion 61, a housing 62, a camera 63, an optical sensor 64, a power supply button 65, buttons 66, a speaker 67, a microphone 68, a light source 69, the inclination sensor 87, and the like. Although FIG. 1 shows an example of a structure in which a plurality of the buttons 66 are provided, one embodiment of the present invention is not limited thereto. For example, one of the buttons 66 may be provided.

FIG. 1 shows a state where a pointing object 81 is positioned between the display portion 61 of the display apparatus of the electronic device 30 and a light source 82 and part of a shadow 83 of the pointing object 81 lies over an icon 71 displayed on the display portion 61. Note that the light source 82 is a light source that can irradiate light having illuminance high enough to make a shadow of the pointing object 81, such as light from a light bulb, a fluorescent lamp, or an LED, sunlight, or the light or sunlight reflected, and that can emit light with a wavelength to which a light-receiving device included in the display portion 61 is sensitive. As the light, for example, visible light, infrared light, or light containing both visible light and infrared light can be used.

The pointing object is an object for giving instruction operation to a target; here, a finger of a hand is shown as an example of the pointing object. As the pointing object 81, not a finger of a hand but an object capable of blocking light such as a pen, a stylus, or a part of the body other than a finger of a hand can be used. The surface of the object is preferably capable of reflecting light.

The display portion 61 has a light-receiving function in the display apparatus of one embodiment of the present invention and with the light-receiving function, the position and shape of the shadow 83 of the pointing object 81 can be detected and a pointed position on the display portion 61 can be recognized. The display apparatus can display a pointer 72 at the pointed position that has been recognized, for example. The pointer 72 allows the user to visually recognize the pointed position and to easily select the icon 71, for example. Displaying the pointer 72 is particularly effective in the case where the light source 82 emits infrared light because in that case, the shadow 83 cannot be visually recognized.

Figure 2A:
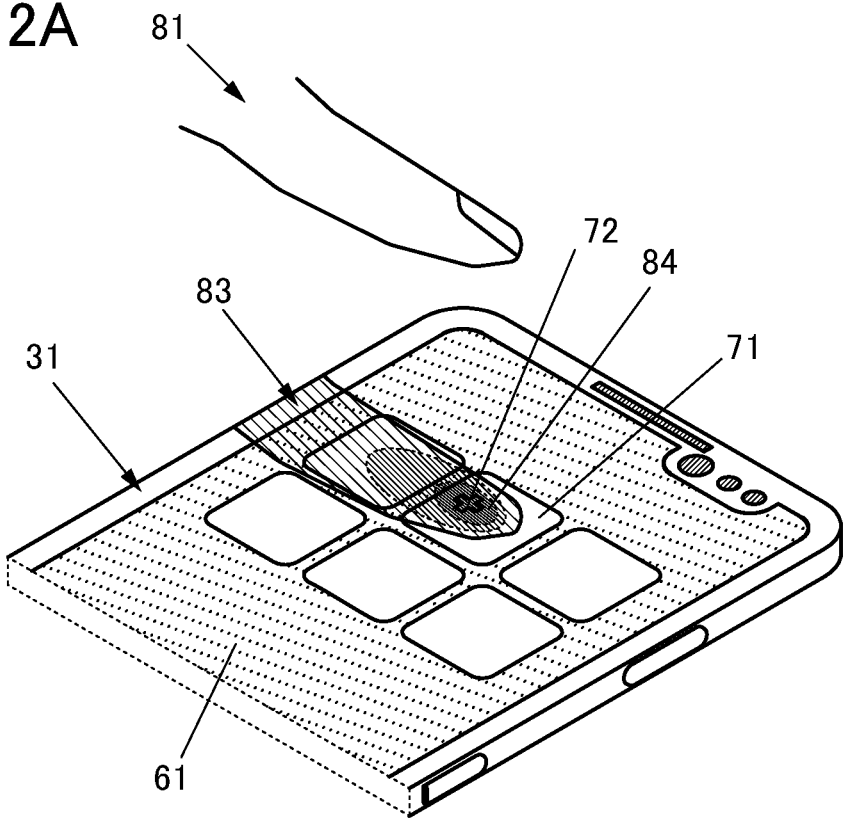
FIG. 2A and FIG. 2B are diagrams illustrating an electronic device.

Note that the shadow 83 is prevented from being uniform owing to the positional relation between the display portion 61, the pointing object 81, and the light source 82, so that the shadow 83 has gradation as shown in FIG. 2A. Typically, the light source 82 is positioned such that the distance between the light source 82 and the display portion 61 is longer than that between the display portion 61 and the pointing object 81, in which case irradiation of the pointing object 81 with the light emitted by the light source 82 causes diffraction at the end portion of the pointing object 81. Accordingly, the end portion of the shadow is thin. In other words, by light diffraction, a shadow of a part of the pointing object 81 at a short distance from the display portion 61 is made deep, and a shadow of a part of the pointing object 81 at a relatively large distance from the display portion 61 is made thin. The pointing object 81 between the display portion 61 and the light source 82 blocking light makes the shadow 83; however, as described above, light diffraction prevents the light from being completely blocked. That is, the part of the shadow 83 can be regarded as a region irradiated with attenuated light.

Thus, the whole of a deep portion 84 of the shadow, the center or the center of gravity of the deep portion 84, or the vicinity of any of these can be recognized as a pointed position and the pointer 72 can be displayed. Note that the whole of the shadow 83 may be recognized as a pointed position in some cases.

Figure 2B:
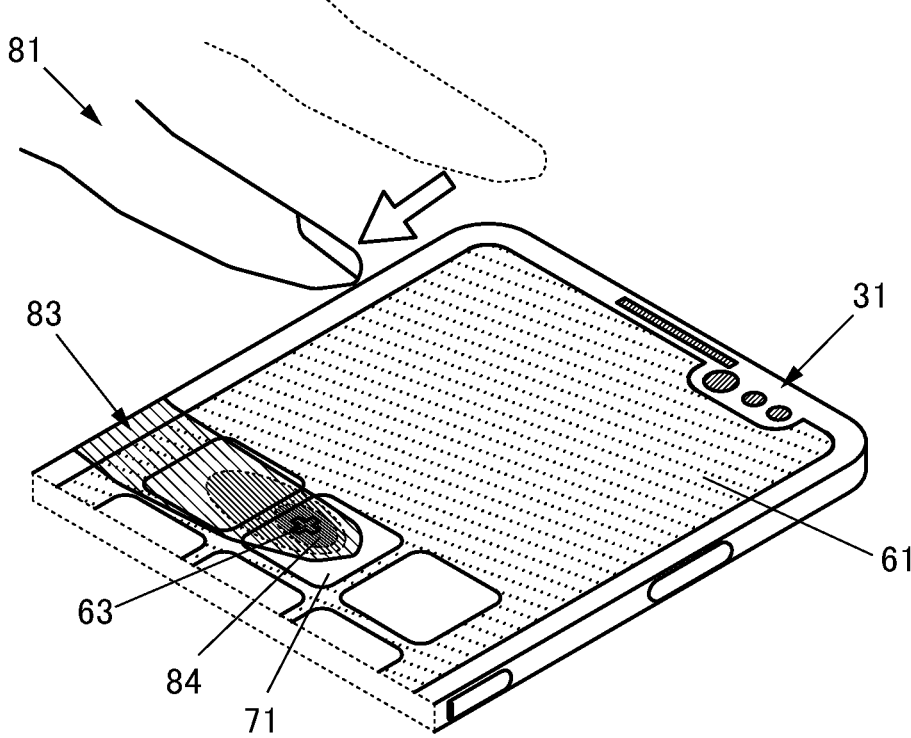

The user can operate the pointer 72 by moving the pointing object 81. For example, the user can perform tap operation or hold operation on a touch panel by moving the pointing object 81 up and down and thereby changing the area or depth of the deep portion 84 of the shadow. Furthermore, as shown in FIG. 2B, operation for moving the pointer 72 subsequent to hold operation enables swipe operation. That is, moving the pointing object 81 can change display on the display portion 61.

Examples of changing display include switching an image displayed on the display portion 61, e.g., operation for launching a program, operation for scrolling a screen, operation for displaying a photograph or an image on the display portion, or operation for temporarily bringing the display portion 61 into a non-lighting state, and bringing the display apparatus into an off state through operation for moving the pointing object 81.

Figures 3A, 3B:
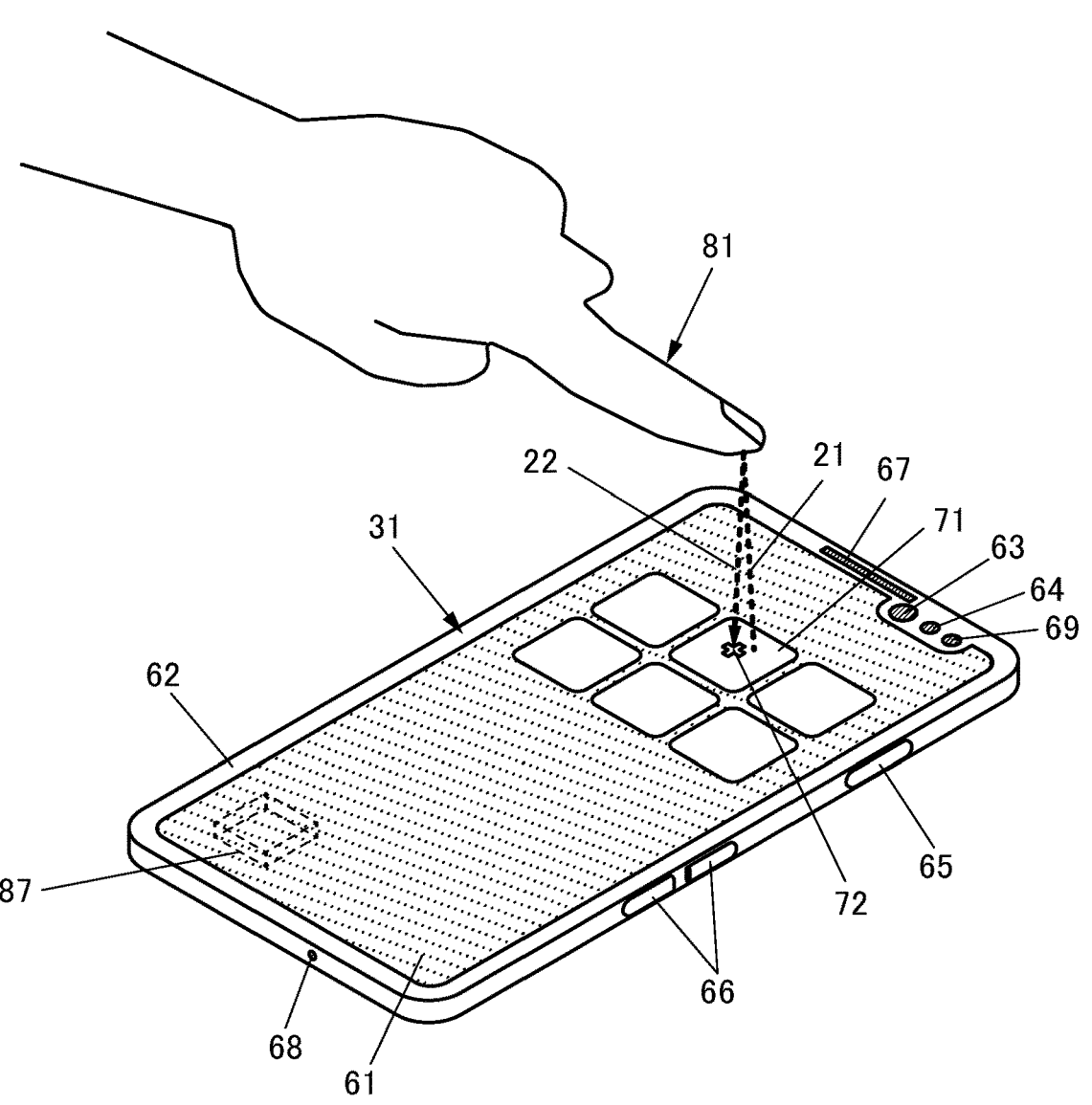
FIG. 3A is a diagram illustrating an electronic device.
FIG. 3B is a diagram illustrating a non-display state (black insertion).

As shown in FIG. 3A, the display portion 61 has a light-emitting function in the display apparatus of one embodiment of the present invention; the pointing object 81 can be irradiated with light 21 owing to the light-emitting function, reflected light 22 can be received owing to the light-receiving function, and the position pointed by the pointing object 81 can be thereby recognized. As in the case of detecting the position of the shadow 83, the pointer 72 can be displayed at the pointed position on the display portion 61 that has been recognized.

Such functions of emitting the light 21 from the display portion 61 and receiving the reflected light 22 are effective in an environment without any light source that irradiates the display portion 61 with sufficient light. For example, these functions can be used outdoors at night and indoors without sufficient illuminance, and can also be used under backlight.

The light 21 is preferably infrared light. Being invisible light, infrared light does not impair the visibility of display. Usable infrared light ranges from near-infrared light to far-infrared light; however, a heat source or the like for far-infrared light causes noise and it is thus preferable to use light with a peak in near-infrared light (wavelength: 720 nm to 2500 nm).

Irradiation with infrared light (the light 21) from the display portion 61 and receiving operation for the light 22 by the display portion 61 are preferably performed in a period in which the display portion 61 is in a non-display state (also referred to as black display or black insertion). In a displaying method using a display device such as an organic EL element or a liquid crystal element, a period in which a display portion is in a non-display state (insertion of an all-black image PB) is provided between images (an image P1, an image P2, and an image P3) of sequential frames to prevent a residual image as shown in FIG. 3B.

The light-receiving device included in the display portion 61 is sensitive to visible light and infrared light and thus, light (visible light) emitted from the display device is noise. It is thus preferable that light-emitting operation and light-receiving operation in the display portion 61 be performed in the period in which the display portion 61 is in a non-display state.

As described above, the electronic device 30 of one embodiment of the present invention can optically perform operation that corresponds to touch operation of a touch panel with the use of the light-receiving device, enabling noncontact operation. Accordingly, the electronic device 30 can be operated in the case where a display apparatus 31 is out of reach. In addition, the need for a part of the body such as a finger to directly touch the display portion 61 or the like is eliminated, enabling hygienic use of the electronic device.

Although the description for FIG. 1 to FIG. 3 uses an expression "a shadow or reflected light is detected with the light-receiving device", in actual operation, first, image capturing data is acquired for substantially the entire area of the display portion 61. Then, the position and shape of a portion corresponding to the shadow or reflected light are extracted from the image capturing data.

Figure 4A:
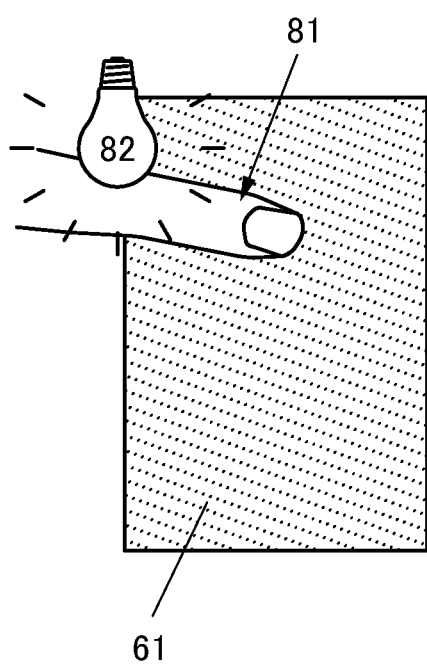
FIG. 4A to FIG. 4D are diagrams illustrating image capturing data (images) acquired with a display portion.
Figure 4B:
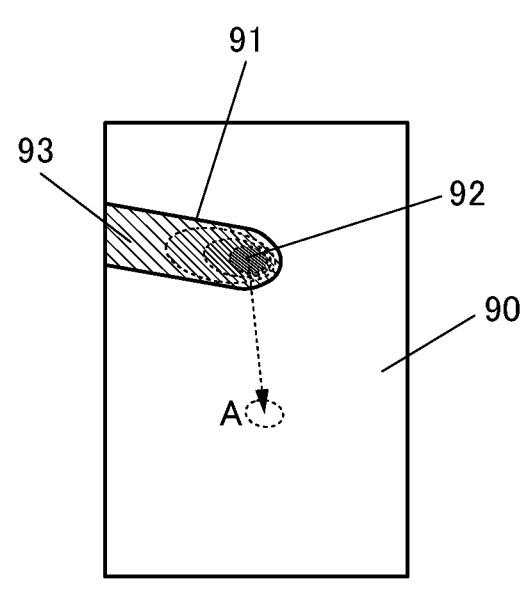

FIG. 4A and FIG. 4B are diagrams illustrating extraction of a shadow. FIG. 4A shows a state where the pointing object 81 is over the display portion 61 and the light source 82 is over the pointing object 81. FIG. 4B shows image capturing data obtained in the state of FIG. 4A.

The image capturing data shown in FIG. 4B corresponds to an image. The whole image can be divided into a region 91 where the pointing object 81 blocks light and a region 90 other than the region 91. An image of the region 91 is captured as a region darker than the region 90. The region 91 can be further divided into a dark portion 92, a bright portion 93, and the like in stages.

The dark portion 92 and the bright portion 93 are generated by the above-described light diffraction, and the dark portion 92 can be regarded as a region with the deepest shadow (a portion of the pointing object 81 with the shortest distance to the display portion 61). Thus, the dark portion 92, the center or the center of gravity of the dark portion 92, or the vicinity thereof can be regarded as a pointed position.

In other words, a second region that is surrounded by a first region provided with the light-receiving device detecting light with intensity higher than or equal to first intensity and that is provided with the light-receiving device detecting light with intensity lower than the first intensity and the vicinity of the second region can be recognized as the position pointed by the pointing object 81.

In the next step, similar image capturing data is acquired, motion, a change in the area, or the like of the dark portion 92 is detected, and hold operation, tap operation, and the like can be associated. Note that swipe operation, scroll operation, and the like may be performed by detecting motion or the like of the entire region 91.

As shown in FIG. 4B, for example, the position of the region 91 or the dark portion 92 may be corrected to a different position (a position A). A shadow is sometimes made at a position different from a position perceived by the user depending on the orientation of the display apparatus with respect to the light source, the inclination of the display apparatus in use, and the like. In such a case, the above correction can be performed in accordance with information on the inclination and orientation of the display apparatus that are detected with the inclination sensor 87 of the electronic device. As a result of the above correction, the pointer 72 can be displayed at the position A, so that operability for the user can be enhanced.

Figure 4C:
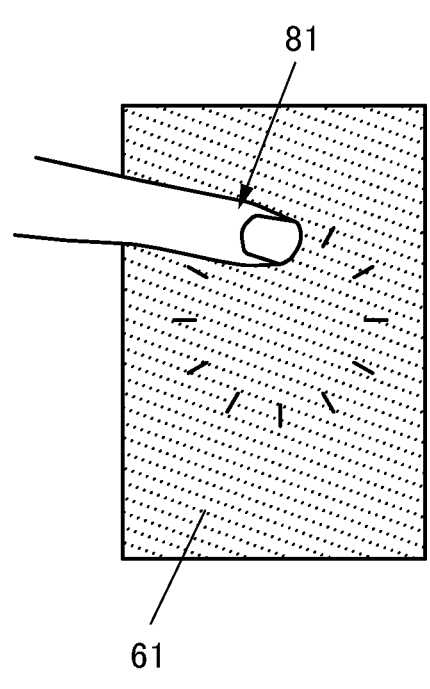
Figure 4D:
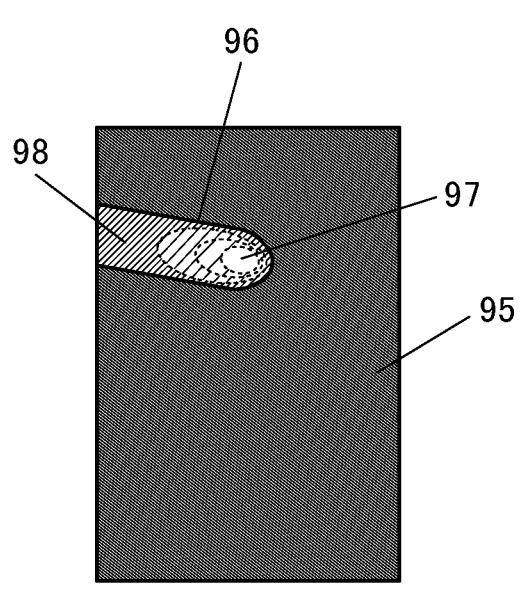

FIG. 4C and FIG. 4D are diagrams illustrating extraction of reflected light. FIG. 4C shows a state where the pointing object 81 is over the display portion 61 and a light source in the display portion 61 emits light. FIG. 4D shows image capturing data obtained in the state of FIG. 4C.

The image capturing data shown in FIG. 4D corresponds to an image. The whole image can be divided into a region 96 where the pointing object 81 is irradiated with light and reflected light is received and a region 95 other than the region 96. An image of the region 96 is captured as a region brighter than the region 95. The region 96 can be further divided into a bright portion 97, a dark portion 98, and the like in stages.

The bright portion 97 and the dark portion 98 are generated by attenuation of the light reaching the pointing object 81 from the light source and attenuation of the light reflected by the pointing object 81 and reaching the light-receiving device, for example, and the bright portion 97 can be assumed to be a region with the most intense reflected light (a portion of the pointing object 81 with the shortest distance to the display portion 61). Thus, the bright portion 97, the center or the center of gravity of the bright portion 97, or the vicinity thereof can be regarded as a pointed position.

In other words, a second region that is surrounded by a first region provided with the light-receiving device detecting light with intensity lower than or equal to second intensity and that is provided with the light-receiving device detecting light with intensity higher than the second intensity and the vicinity of the second region can be recognized as the position pointed by the pointing object 81.

In the next step, similar image capturing data is acquired, motion, a change in the area, or the like of the bright portion 97 is detected, and hold operation, tap operation, and the like can be associated. Note that swipe operation, scroll operation, and the like may be performed by detecting motion or the like of the entire region 96.

Although not shown, the position of the bright portion 97 or the like can be corrected in a step similar to that in FIG. 4B, and the pointer 72 can be displayed at a corrected position.

The display apparatus can switch the first function of detecting the position pointed by the pointing object 81 by using a shadow lying over the display portion and the second function of detecting the position pointed by the pointing object 81 by using reflected light. For example, the display apparatus can be controlled such that detection operation is performed with the first function in the case where the light-receiving device detects light irradiated from a light source outside the display portion and the detected light has predetermined intensity, and detection operation is performed with the second function in the case where the detected light has lower intensity. Similar operation may be performed with the optical sensor of the electronic device.

Figure 5:
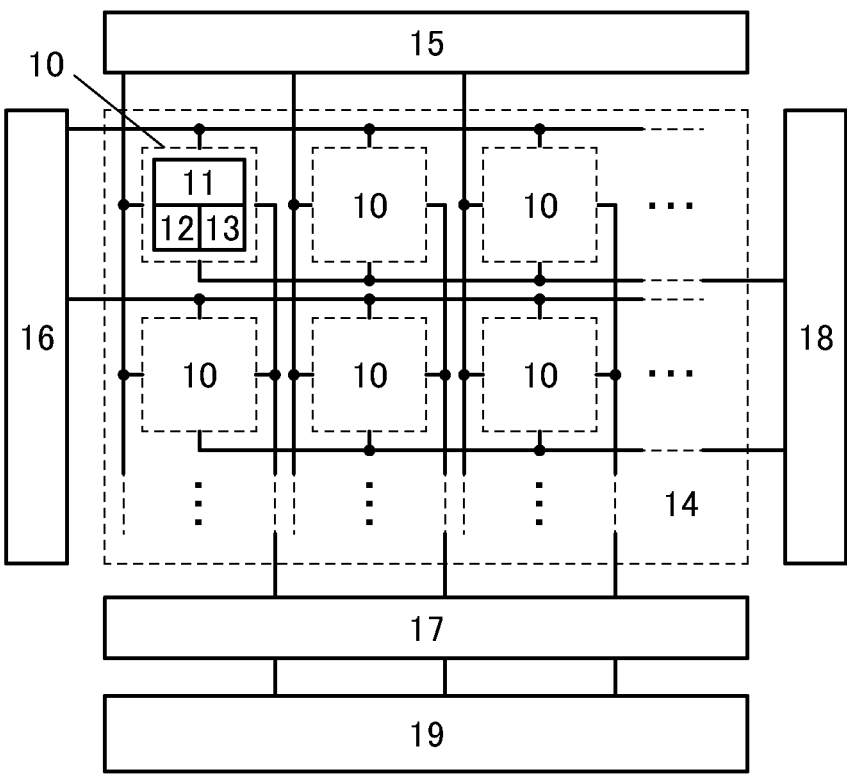
FIG. 5 is a diagram illustrating a display apparatus.

FIG. 5 is a diagram illustrating a display apparatus of one embodiment of the present invention. A pixel 10 can include subpixels 11, 12, and 13. For example, the subpixel 11 has a function of emitting light for display. The subpixel 12 has a function of emitting light with which a pointing object is to be irradiated. The subpixel 13 has a function of detecting light that has been emitted by the subpixel 12 and reflected by the pointing object.

Note that in this specification, although a minimum unit in which independent operation is performed in one "pixel" is defined as a "subpixel" in the description for convenience, a "pixel" may be replaced with a "region" and a "subpixel" may be replaced with a "pixel".

The subpixel 11 includes a display device that emits visible light. The subpixel 12 includes a light-emitting device that emits infrared light.

As the display device and the light-emitting device, EL elements such as OLEDs (Organic Light Emitting Diodes) or QLEDs (Quantum-dot Light Emitting Diodes) are preferably used. Examples of a light-emitting substance included in the EL element include a substance emitting fluorescent light (a fluorescent material), a substance emitting phosphorescent light (a phosphorescent material), a substance exhibiting thermally activated delayed fluorescence (a thermally activated delayed fluorescence (TADF) material), and an inorganic compound (e.g., a quantum dot material). Alternatively, an LED such as a micro-LED (Light Emitting Diode) can be used as the light-emitting device.

The subpixel 13 includes a light-receiving device that has sensitivity to visible light and infrared light. A photoelectric conversion element that detects incident light and generates charge can be used as the light-receiving device. In the light-receiving device, the amount of charge to be generated is determined on the basis of the amount of incident light. For example, a pn or pin photodiode can be used as the light-receiving device.

As the light-receiving device, an organic photodiode including an organic compound in a photoelectric conversion layer is preferably used. An organic photodiode is easily made thin and lightweight and easily has a large area. In addition, an organic photodiode can be used in a variety of display apparatuses because of its high flexibility in shape and design. Alternatively, a photodiode including crystalline silicon (e.g., single crystal silicon, polycrystalline silicon, or microcrystalline silicon) can be used as the light-receiving device.

In one embodiment of the present invention, an organic EL element is used as the light-emitting device, and an organic photodiode is used as the light-receiving device. A large number of layers in the organic photodiode can have structures in common with the layers in the organic EL element. Accordingly, the light-receiving device can be incorporated into the display apparatus without a significant increase in the number of manufacturing steps. For example, the photoelectric conversion layer of the light-receiving device and the light-emitting layer of the light-emitting device may be separately formed, and the other layers may have the same structure for the light-emitting device and the light-receiving device.

A circuit 15 and a circuit 16 are driver circuits for driving the subpixels 11 and 12. The circuit 15 can have a function of a source driver and the circuit 16 can have a function of a gate driver. A shift register circuit or the like can be used as the circuit 15 and the circuit 16, for example.

Note that the driver circuits for the subpixels 11 and 12 may be separated. A main function of the subpixel 12 is to irradiate the pointing object 81 with light; therefore, all the subpixels 12 in a pixel array 14 may emit light with the same luminance. Therefore, not high-performance sequential circuits or the like but simple circuits may be used as circuits corresponding to the source driver and the gate driver.

A circuit 17 and a circuit 18 are driver circuits for driving the subpixel 13. The circuit 17 can have a function of a column driver and the circuit 18 can have a function of a row driver. A shift register circuit, a decoder circuit, or the like can be used as the circuit 17 and the circuit 18, for example.

A circuit 19 is a reading circuit for data output from the subpixel 13. The circuit 19 includes, for example, an A/D converter circuit and has a function of converting analog data output from the subpixel 13 into digital data. In addition, the circuit 19 may include a CDS circuit that performs correlated double sampling processing on output data.

The subpixel 12 and the subpixel 13 can have a function of an input interface. The subpixel 13 can receive visible light, infrared light, or light containing visible light and infrared light that is emitted from an external light source. Alternatively, the subpixel 12 can emit infrared light and the subpixel 13 can receive reflected light from the pointing object near the display apparatus. Thus, when a threshold value of the amount of received light detected by the subpixel 13 is set, a function of a sensor switch can be obtained. These make it possible to achieve a function equivalent to a touch sensor without contact. In addition, operation of a pointer or the like can be performed with or without contact.

Image capturing data on a fingerprint, a palm print, an iris, or the like can be obtained with the use of the light-receiving device. That is, a biological authentication function can be added to the display apparatus. Note that image capturing data may be obtained when the pointing object is made to be in contact with the display apparatus.

In addition, image capturing data on facial expression, eye movement, change of the pupil diameter, or the like of the user can be obtained with the use of the light-receiving device. By analysis of the image data, information on the user's physical and mental state can be obtained. On the basis of the information, it is possible to perform operation in accordance with the user's physical and mental state, e.g., to change one or both of display and sound output by the display apparatus. Such operation is effective for devices for VR (Virtual Reality), devices for AR (Augmented Reality), or devices for MR (Mixed Reality).

Figures 6A, 6B, 6C, 6D, 6E, 6F, 6G, 6H, 6I, 6J, 6K:
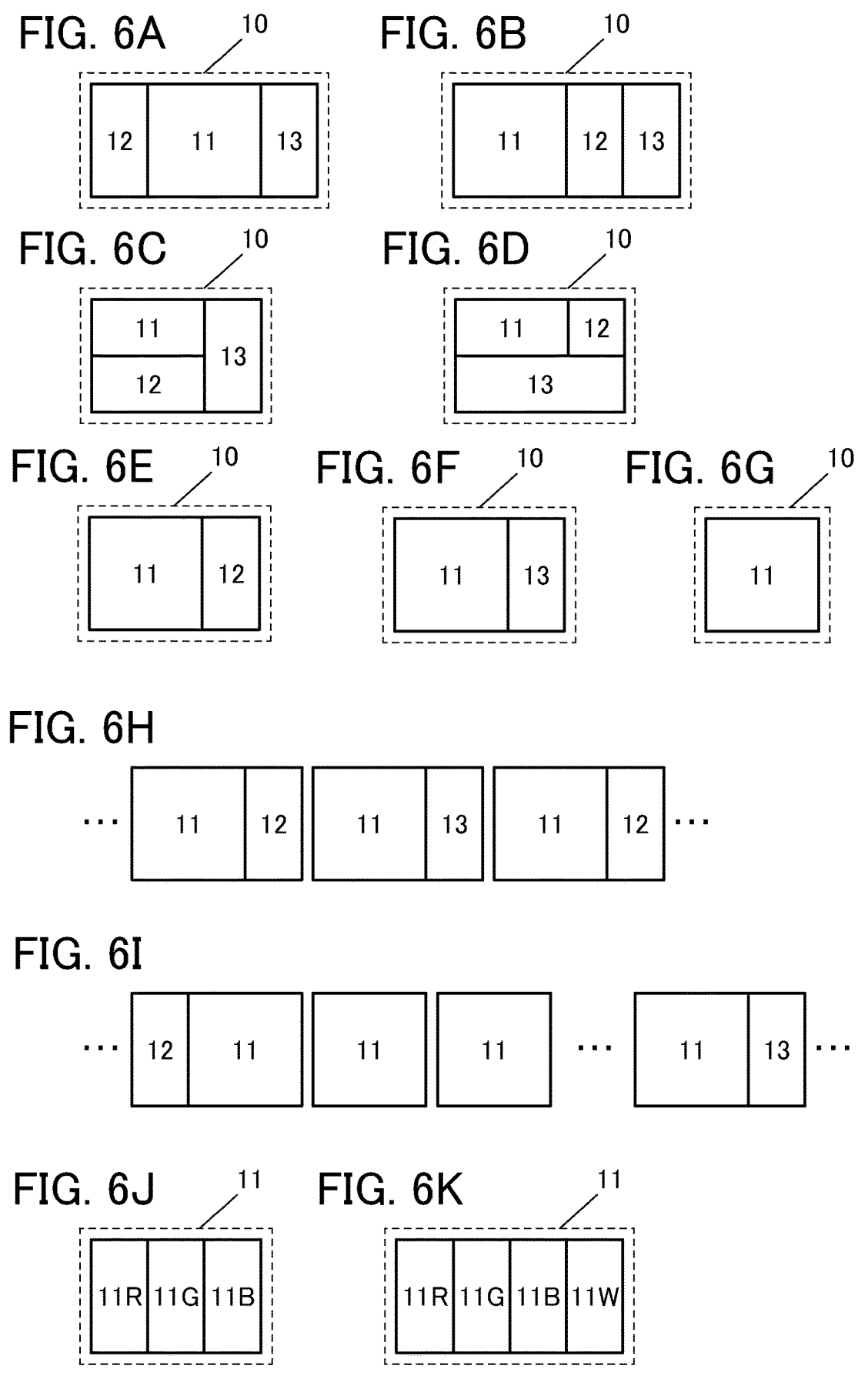

FIG. 6A to FIG. 6G are diagrams illustrating examples of the layout of the subpixels in the pixel 10. As shown in FIG. 6A and FIG. 6B, a structure in which the subpixels are arranged in a horizontal direction (a direction in which gate lines extend) can be employed. Alternatively, as shown in FIG. 5, FIG. 6C, and FIG. 6D, a structure in which the subpixels are arranged in the horizontal direction and a vertical direction (a direction in which source lines extend) may be employed.

Further alternatively, as shown in FIG. 6E and FIG. 6F, a structure in which one pixel 10 does not include one of the subpixel 13 and the subpixel 12 may be employed. In this case, the pixel 10 shown in FIG. 6E and the pixel 10 shown in FIG. 6F can be alternately arranged as shown in FIG. 6H, for example. In addition, the pixel 10 shown in FIG. 6G, which is formed only with the subpixel 11, may be used. In this case, as shown in FIG. 6I, a plurality of the pixels 10 shown in FIG. 6G may be provided between the pixel 10 shown in FIG. 6E and the pixel 10 shown in FIG. 6F. In the arrangement in FIG. 6H or FIG. 6I, the total number of subpixels 11 can be larger than the total number of subpixels 12 and subpixels 13, whereby the display quality can be increased.

By contrast, in the cases where the pixels 10 shown in FIG. 6E to FIG. 6G are used, the number of light sources for irradiating the pointing object and the number of light-receiving devices are reduced, which results in a reduction in the sensitivity of detection for the pointing object in some cases. Accordingly, the structure and arrangement of the subpixels are considered in accordance with the purpose. Note that the number of pixels 10 in FIG. 6E is not necessarily the same as the number of pixels 10 in FIG. 6F in the arrangement shown in FIG. 6H or FIG. 6I.

The subpixel 11 may be a group of subpixels that emit light of different colors as shown in FIG. 6J and FIG. 6K instead of having a structure that emits light of a single color. FIG. 6J is a diagram showing an example in which the subpixel 11 is composed of a subpixel 11R that includes a red-light-emitting device, a subpixel 11G that includes a green-light-emitting device, and a subpixel 11B that includes a blue-light-emitting device. Color display can be performed with the subpixels 11 having the above structure.

Furthermore, a subpixel 11W that includes a white-light-emitting device may be provided as shown in FIG. 6K. Since the subpixel 11W can emit white light by itself, the emission luminance of subpixels of the other colors can be reduced in the case of display of white or a color close to white. Therefore, display can be performed with lower power.

Figure 7A:
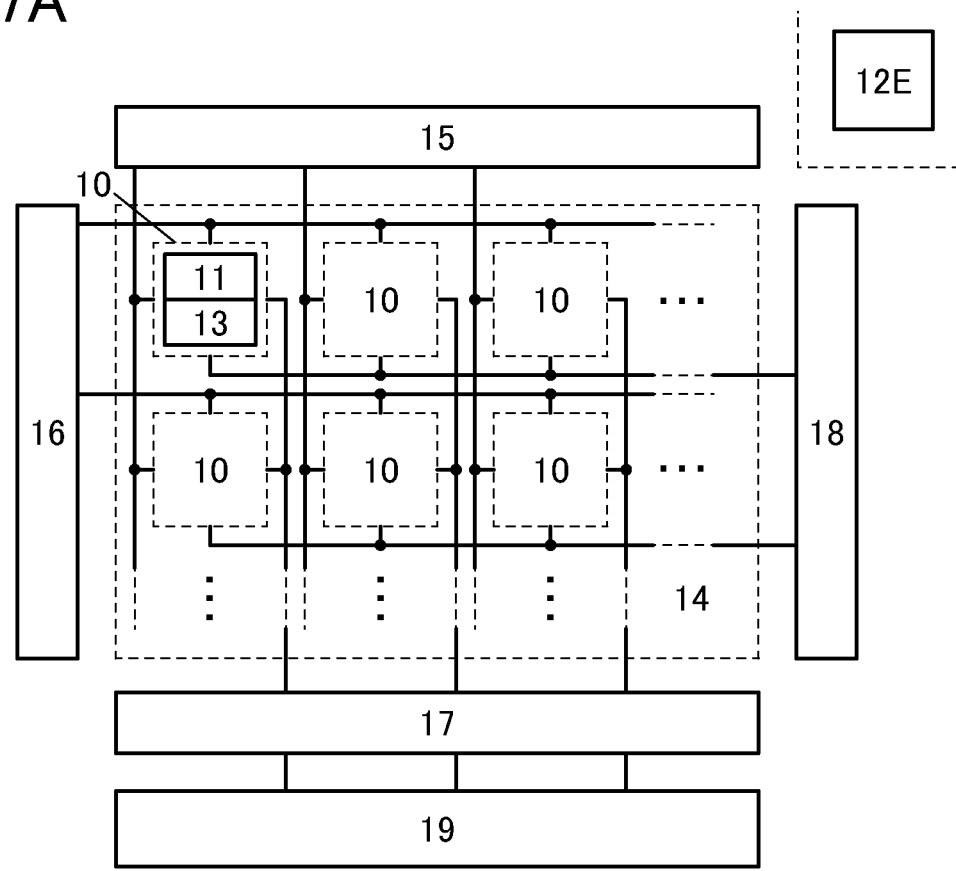
FIG. 7A is a diagram illustrating a display apparatus.
Figure 7B:
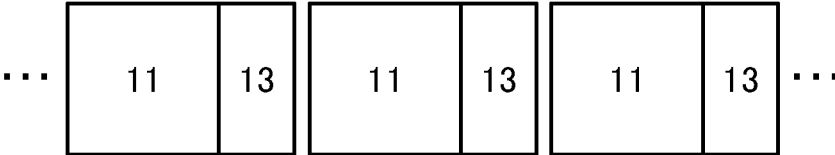
FIG. 7B and FIG. 7C are diagrams each illustrating subpixels.
Figure 7C:
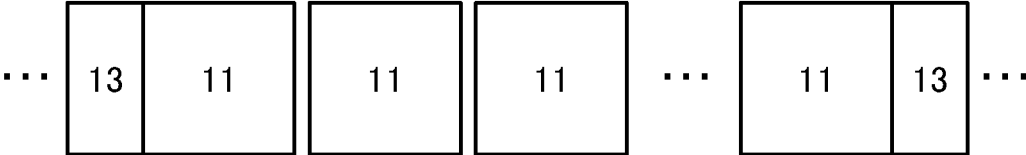

Alternatively, the display apparatus may be configured such that the subpixel 11 and the subpixel 13 constitute the basic structure of the pixel 10 as shown in FIG. 7A. In this case, a light source 12E for irradiating the pointing object is provided outside the pixel array 14 (display portion). For example, an LED that emits near-infrared light with high luminance can be used as the light source 12E. Since the light source 12E is provided outside the pixel array 14, the light source 12E can be turned on by control different from control for the display apparatus. As in arrangement examples shown in FIG. 7B and FIG. 7C, the subpixel 12 is unnecessary and the number of subpixels 13 can be increased, so that the sensitivity of detection for the pointing object can be increased.

Note that the position and the number of light source 12E illustrated in FIG. 7A are just an example and the position and the number of light source 12E are not limited thereto. The light source 12E can be one component of a device that includes the display apparatus of one embodiment of the present invention. Alternatively, the light source 12E may be a device different from the device including the display apparatus of one embodiment of the present invention. For example, the light source 69 of the electronic device 30 shown in FIG. 1 can be used as the light source 12E.

Note that the structures of the pixels and the subpixels are not limited to the above, and any of a variety of arrangement modes can be employed.

Next, a more specific example of the display apparatus of one embodiment of the present invention is described.

Figure 8:
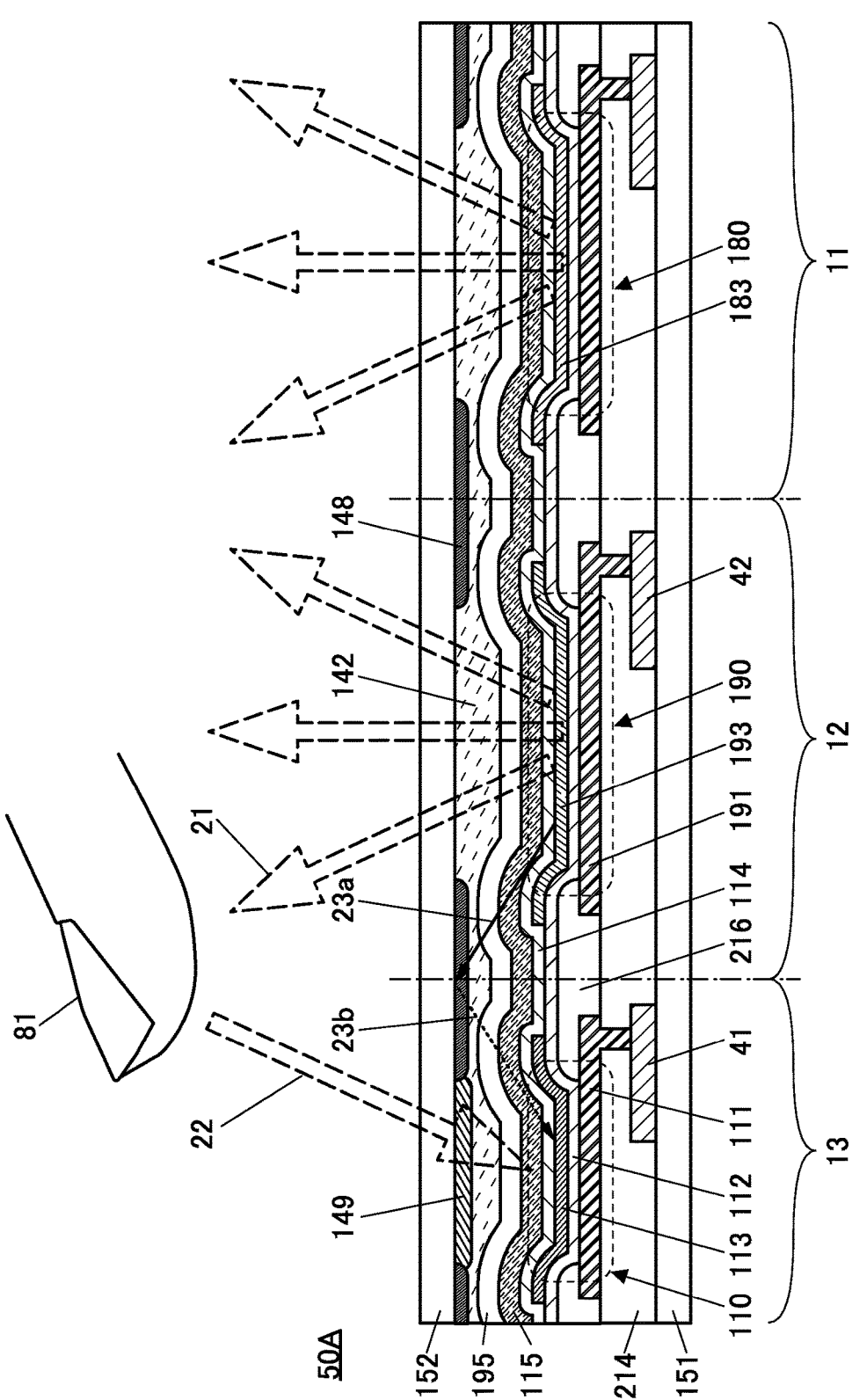
FIG. 8 is a cross-sectional view illustrating a display apparatus.
Figure 9:
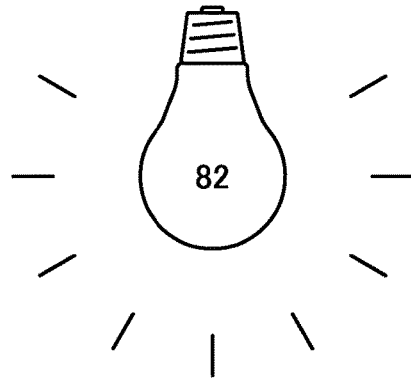
FIG. 9 is a cross-sectional view illustrating a display apparatus.
Figure 9:
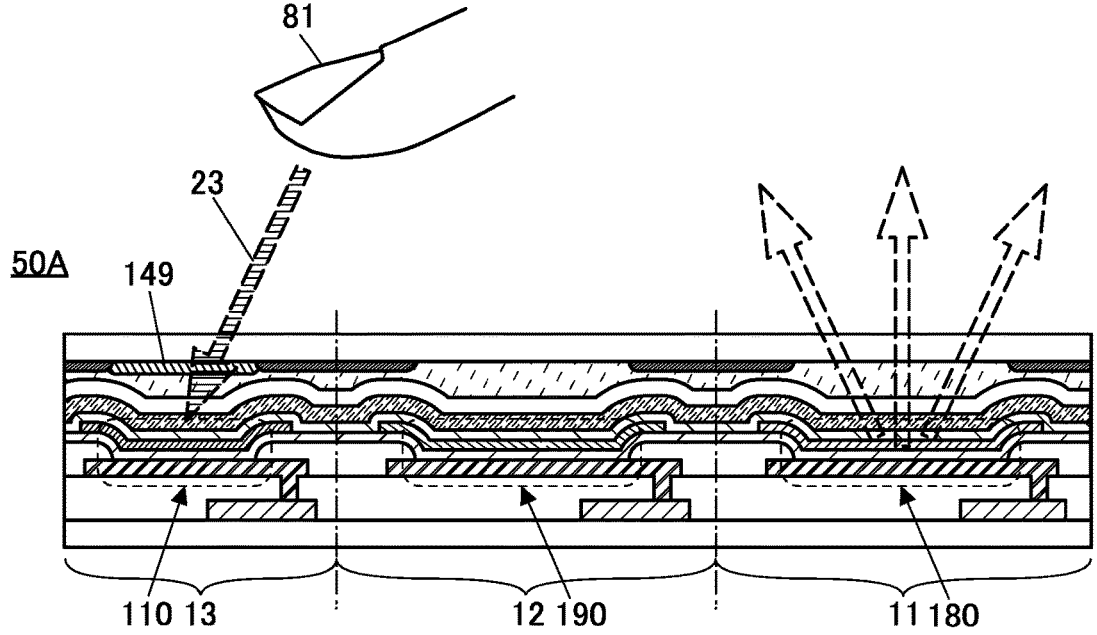

FIG. 8 and FIG. 9 each show a schematic cross-sectional view of a display apparatus 50A of one embodiment of the present invention. FIG. 8 shows a mode in which the pointing object 81 is irradiated with the light 21 emitted by the display apparatus 50A and the display apparatus 50A receives the reflected light 22. FIG. 9 shows a mode in which the display apparatus 50A receives light 23 that has been emitted by the light source 82 and attenuated by being blocked by the pointing object 81.

The display apparatus 50A includes a light-receiving device 110, a light-emitting device 190, and a display device 180. The light-receiving device 110 corresponds to the organic photodiode included in the subpixel 13. The light-emitting device 190 corresponds to the organic EL element (emitting infrared light) included in the subpixel 12. The display device 180 corresponds to the organic EL element (emitting visible light) included in the subpixel 11.

The structures other than the light-emitting layer can be the same for the organic EL element (the display device 180) included in the subpixel 11 and the organic EL element (the light-emitting device 190) included in the subpixel 12. Therefore, the light-emitting device 190 will be described in detail here, and description of the display device 180 will be omitted.

The light-receiving device 110 includes a pixel electrode 111, a common layer 112, a photoelectric conversion layer 113, a common layer 114, and a common electrode 115. The light-emitting device 190 includes a pixel electrode 191, the common layer 112, a light-emitting layer 193, the common layer 114, and the common electrode 115. Note that the display device 180 includes a light-emitting layer 183 that is different from the light-emitting layer 193.

The pixel electrode 111, the pixel electrode 191, the common layer 112, the photoelectric conversion layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is a layer shared by the light-receiving device 110 and the light-emitting device 190.

The photoelectric conversion layer 113 includes a region that overlaps with the pixel electrode 111 with the common layer 112 therebetween. The light-emitting layer 193 includes a region that overlaps with the pixel electrode 191 with the common layer 112 therebetween. The photoelectric conversion layer 113 includes a first organic compound. The light-emitting layer 193 includes a second organic compound different from the first organic compound.

The common layer 114 is positioned over the common layer 112, the photoelectric conversion layer 113, and the light-emitting layer 193. The common layer 114 is a layer shared by the light-receiving device 110 and the light-emitting device 190.

The common electrode 115 includes a region that overlaps with the pixel electrode 111 with the common layer 112, the photoelectric conversion layer 113, and the common layer 114 therebetween. The common electrode 115 further includes a region that overlaps with the pixel electrode 191 with the common layer 112, the light-emitting layer 193, and the common layer 114 therebetween. The common electrode 115 is a layer shared by the light-receiving device 110 and the light-emitting device 190.

In the display apparatus of this embodiment, an organic compound is used for the photoelectric conversion layer 113 of the light-receiving device 110. In the light-receiving device 110, the layers other than the photoelectric conversion layer 113 can have structures in common with the layers in the light-emitting device 190 (the organic EL element). Therefore, the light-receiving device 110 can be formed concurrently with the formation of the light-emitting device 190 only by adding a step of depositing the photoelectric conversion layer 113 in the manufacturing process of the light-emitting device 190. The light-emitting device 190 and the light-receiving device 110 can be formed over one substrate. Accordingly, the light-receiving device 110 can be incorporated into the display apparatus without a significant increase in the number of manufacturing steps.

In the display apparatus 50A, the light-receiving device 110 and the light-emitting device 190 can have a common structure except that the photoelectric conversion layer 113 of the light-receiving device 110 and the light-emitting layer 193 of the light-emitting device 190 are separately formed. Note that the structures of the light-receiving device 110 and the light-emitting device 190 are not limited thereto. The light-receiving device 110 and the light-emitting device 190 may include a separately formed layer other than the photoelectric conversion layer 113 and the light-emitting layer 193 (see display apparatuses 50C, 50D, and 50E described later). The light-receiving device 110 and the light-emitting device 190 preferably include one or more shared layers (common layer(s)). In this case, the light-receiving device 110 can be incorporated into the display apparatus without a significant increase in the number of manufacturing steps.

The display apparatus 50A includes the light-receiving device 110, the light-emitting device 190, a transistor 41, a transistor 42, and the like between a pair of substrates (a substrate 151 and a substrate 152).

In the light-receiving device 110, the common layer 112, the photoelectric conversion layer 113, and the common layer 114 that are positioned between the pixel electrode 111 and the common electrode 115 can each be referred to as an organic layer (a layer containing an organic compound). The pixel electrode 111 preferably has a function of reflecting visible light and infrared light. The common electrode 115 has a function of transmitting visible light and infrared light.

The light-receiving device 110 has a function of detecting light. Specifically, the light-receiving device 110 is a photoelectric conversion element that converts the incident light 22 (visible light, infrared light, or light containing both visible light and infrared light) into an electrical signal.

A light-blocking layer 148 is provided on a surface of the substrate 152 on the substrate 151 side. The light-blocking layer 148 has opening potions in a position overlapping with the light-receiving device 110 and in a position overlapping with the light-emitting device 190. Providing the light-blocking layer 148 can control the range where the light-receiving device 110 detects light.

A material that blocks light emitted by the light-emitting device 190 can be used for the light-blocking layer 148. The light-blocking layer 148 preferably absorbs visible light and infrared light. The light-blocking layer 148 can be formed using a metal material or a resin material containing pigment (e.g., carbon black) or dye, for example. The light-blocking layer 148 may have a stacked-layer structure of a red color filter, a green color filter, and a blue color filter.

A filter 149 that filters out light with wavelengths shorter than the wavelength of visible light may be provided in the opening portion of the light-blocking layer 148 which is provided in the position overlapping with the light-receiving device 110. For example, a long pass filter that filters out light (ultraviolet light) having shorter wavelengths than visible light or the like can be used as the filter 149. An inorganic insulating film as well as a resin film or the like can be used as the filter that filters out ultraviolet light. Providing the filter 149 can inhibit ultraviolet light from entering the light-receiving device 110, so that visible light and infrared light can be detected with less noise.

Figure 10A:
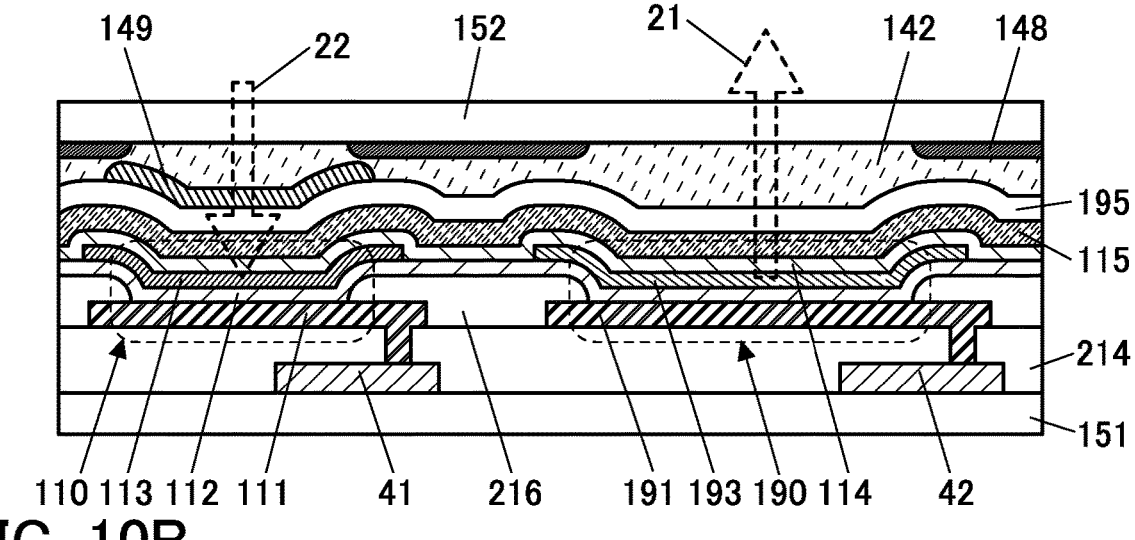
FIG. 10A to FIG. 10C are cross-sectional views each illustrating a display apparatus.

Note that the filter 149 may be provided to be stacked with the light-receiving device 110, as shown in FIG. 10A.

Figure 10B:
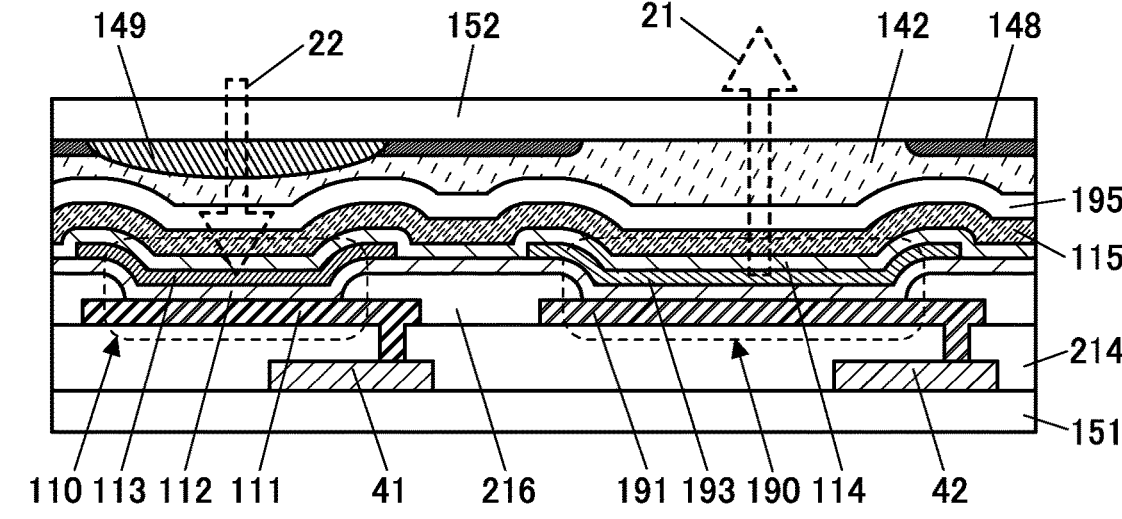

Alternatively, the filter 149 may have a lens shape as shown in FIG. 10B. The lens-type filter 149 is a convex lens having a convex surface on the substrate 151 side. Note that the filter 149 may be positioned so that the convex surface is on the substrate 152 side.

In the case where both the light-blocking layer 148 and the lens-type filter 149 are formed on the same surface of the substrate 152, their formation order is not limited. Although FIG. 10B shows an example in which the lens-type filter 149 is formed first, the light-blocking layer 148 may be formed first. In FIG. 10B, end portions of the lens-type filter 149 are covered with the light-blocking layer 148.

In the structure illustrated in FIG. 10B, the light 22 enters the light-receiving device 110 through the lens-type filter 149. When the filter 149 is a lens-type filter, the image capturing range of the light-receiving device 110 can be narrowed to be inhibited from overlapping with the image capturing range of an adjacent light-receiving device 110. Thus, a clear image with little blurring can be captured. In addition, when the filter 149 is a lens-type filter, the opening of the light-blocking layer 148 over the light-receiving device 110 can be large. Thus, the amount of light entering the light-receiving device 110 can be increased, so that light detection sensitivity can be increased.

The lens-type filter 149 can be directly formed on the substrate 152 or the light-receiving device 110. Alternatively, a separately formed microlens array or the like may be bonded to the substrate 152.

Figure 10C:
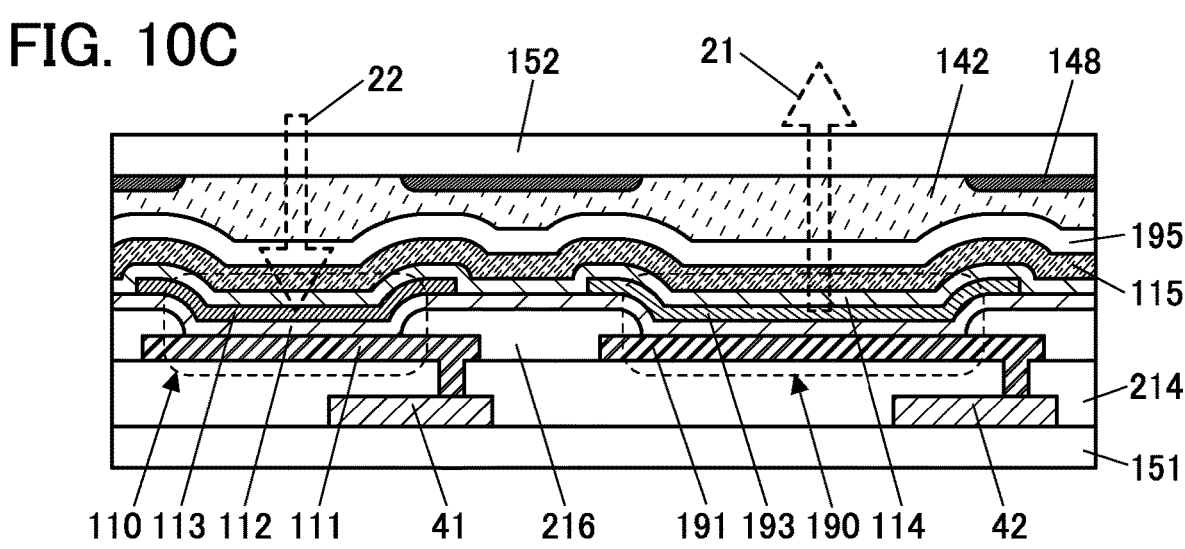

A structure without the filter 149 may be employed as shown in FIG. 10C. The filter 149 can be omitted in the case where the light-receiving device 110 has characteristics such that it has no sensitivity to ultraviolet light or has sensitivity to visible light and infrared light sufficiently higher than that to ultraviolet light. In this case, a lens having a shape similar to that of the lens-type filter 149 shown in FIG. 10B may be provided to overlap with the light-receiving device 110.

Here, the light-receiving device 110 can detect the light 22 reflected by the pointing object 81 such as a finger, of the light 21 emitted by the light-emitting device 190, as shown in FIG. 8. However, in some cases, part of the light emitted by the light-emitting device 190 is reflected inside the display apparatus 50A and enters the light-receiving device 110 without via the pointing object 81.

The light-blocking layer 148 can reduce the influence of such stray light. For example, in the case where the light-blocking layer 148 is not provided, light 23a emitted by the light-emitting device 190 is reflected by the substrate 152 or the like and reflected light 23b enters the light-receiving device 110 in some cases. Providing the light-blocking layer 148 can inhibit entry of the reflected light 23b into the light-receiving device 110. Hence, noise can be reduced and the accuracy of light detection of the light-receiving device 110 can be increased.

In the light-emitting device 190, the common layer 112, the light-emitting layer 193, and the common layer 114 that are positioned between the pixel electrode 191 and the common electrode 115 can each be referred to as an EL layer. The pixel electrode 191 preferably has a function of reflecting at least infrared light.

The light-emitting device 190 has a function of emitting infrared light. Specifically, the light-emitting device 190 is an electroluminescent device that emits the light 21 to the substrate 152 side by application of voltage between the pixel electrode 191 and the common electrode 115.

The pixel electrode 111 is electrically connected to a source or a drain of the transistor 41 through an opening provided in the insulating layer 214. An end portion of the pixel electrode 111 is covered with a partition 216.

The pixel electrode 191 is electrically connected to a source or a drain of the transistor 42 through an opening provided in the insulating layer 214. An end portion of the pixel electrode 191 is covered with the partition 216. The transistor 42 has a function of controlling the driving of the light-emitting device 190.

The transistor 41 and the transistor 42 are on and in contact with the same layer (the substrate 151 in FIG. 8).

At least part of a circuit electrically connected to the light-receiving device 110 is preferably formed using the same material in the same step as a circuit electrically connected to the light-emitting device 190. In this case, the thickness of the display apparatus can be smaller and the manufacturing process can be simpler than in the case where the two circuits are separately formed.

The light-receiving device 110 and the light-emitting device 190 are preferably covered with a protective layer 195. FIG. 8 shows an example in which the protective layer 195 is provided on and in contact with the common electrode 115. Providing the protective layer 195 can inhibit entry of impurities such as water into the light-receiving device 110 and the light-emitting device 190, thereby increasing the reliability of the light-receiving device 110 and the light-emitting device 190. The protective layer 195 and the substrate 152 are bonded to each other with an adhesive layer 142.

Figures 11A, 11B:
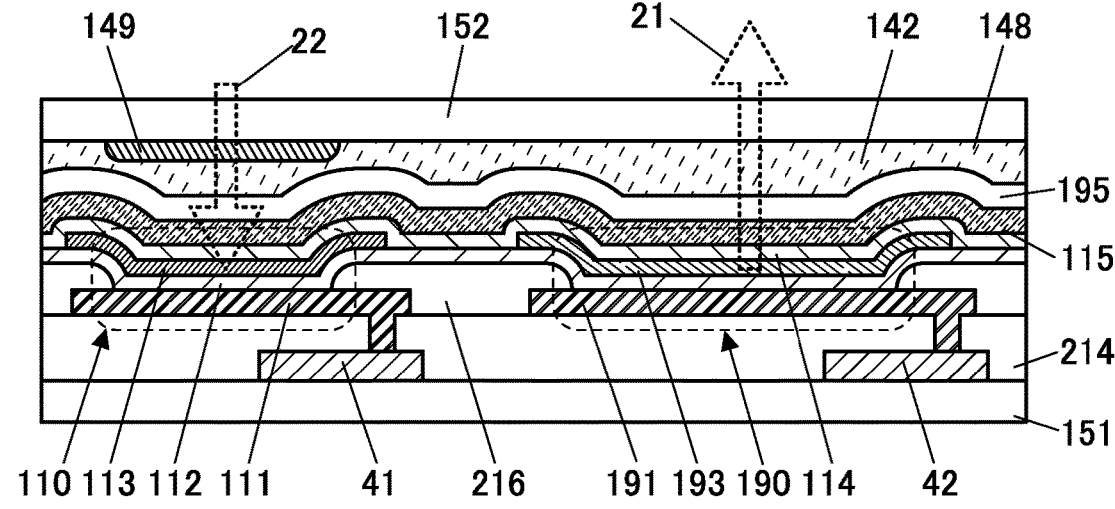
FIG. 11A and FIG. 11B are cross-sectional views each illustrating a display apparatus.

A structure in which no protective layer 195 is provided over the light-receiving device 110 and the light-emitting device 190 may be employed as shown in FIG. 11A. In this case, the common electrode 115 and the substrate 152 are bonded to each other with the adhesive layer 142.

A structure without the light-blocking layer 148 may be employed as shown in FIG. 11B. In this case, the amount of light which the light-emitting device 190 emits to the outside and the amount of light received by the light-receiving device 110 can be increased, so that the detection sensitivity can be increased.

Figure 12A:
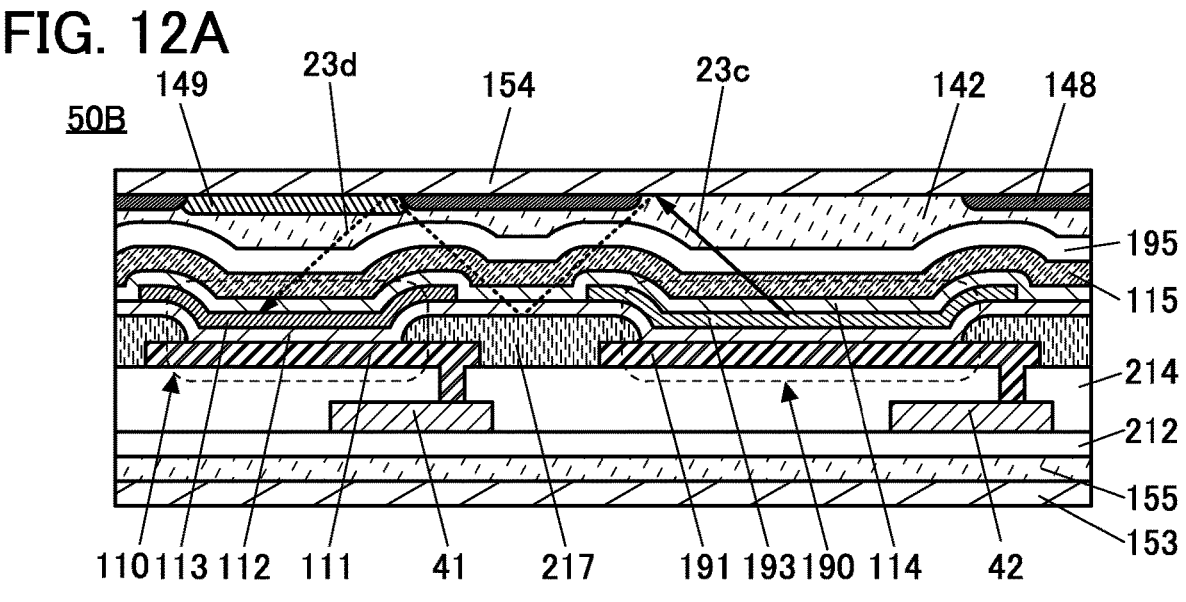
FIG. 12A and FIG. 12B are cross-sectional views each illustrating a display apparatus.

The display apparatus of one embodiment of the present invention may have a structure of a display apparatus 50B shown in FIG. 12A. The display apparatus 50B differs from the display apparatus 50A in that the substrate 151, the substrate 152, and the partition 216 are not included and a substrate 153, a substrate 154, an adhesive layer 155, an insulating layer 212, and a partition 217 are included.

The substrate 153 and the insulating layer 212 are bonded to each other with the adhesive layer 155. The substrate 154 and the protective layer 195 are bonded to each other with the adhesive layer 142.

The display apparatus 50B has a structure formed by transferring, onto the substrate 153, the insulating layer 212, the transistor 41, the transistor 42, the light-receiving device 110, the light-emitting device 190, and the like that are formed over a formation substrate. The substrate 153 and the substrate 154 are preferably flexible. Accordingly, flexibility can be imparted to the display apparatus 50B. For example, a resin is preferably used for the substrate 153 and the substrate 154.

For the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamideimide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used. Glass that is thin enough to have flexibility may be used for one or both of the substrate 153 and the substrate 154.

As the substrate included in the display apparatus of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

The partition 217 is preferably capable of absorbing light emitted by the light-emitting device 190. The partition 217 can be formed using, for example, a resin material containing a pigment or dye.

Part of light 23c emitted by the light-emitting device 190 is reflected by the substrate 152 and the partition 217. The reflected light, 23d, sometimes enters the light-receiving device 110. Furthermore, the light 23c sometimes passes through the partition 217 and is reflected by a transistor, a wiring, or the like, and thus reflected light can enter the light-receiving device 110. When the partition 217 absorbs the light 23c, the reflected light 23d can be inhibited from entering the light-receiving device 110. Hence, noise can be reduced, and the accuracy of light detection of the light-receiving device 110 can be increased.

The partition 217 preferably absorbs at least light with a wavelength that can be detected by the light-receiving device 110. For example, in the case where the light-receiving device 110 detects infrared light emitted by the light-emitting device 190, it is preferable that the partition 217 can absorb at least infrared light and can also absorb visible light.

Although the light-emitting device and the light-receiving device include two common layers in the above-described example, one embodiment of the present invention is not limited thereto. Examples in which common layers have different structures are described below.

Figure 12B:
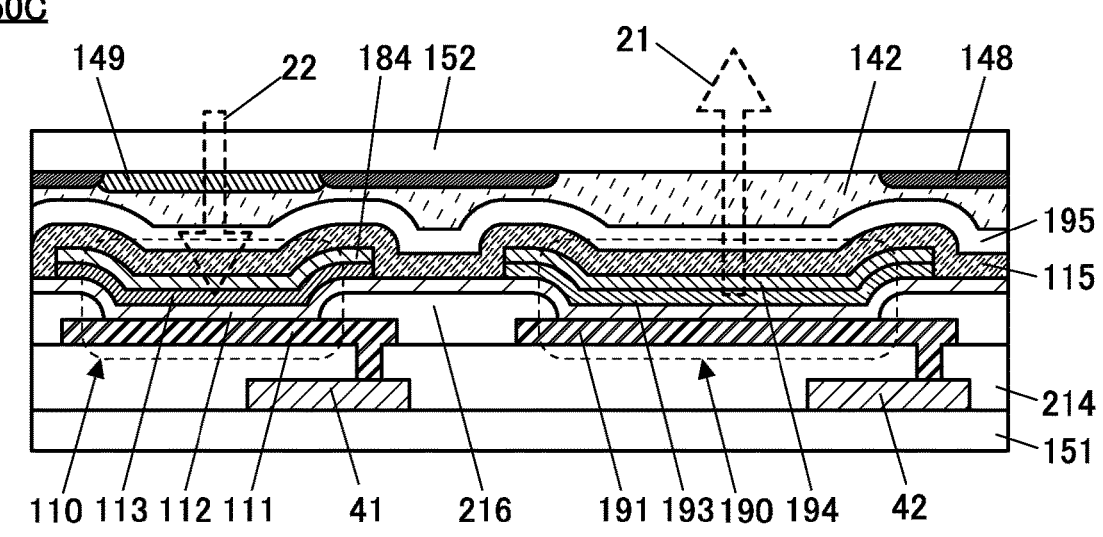

FIG. 12B is a schematic cross-sectional view of the display apparatus 50C. The display apparatus 50C differs from the display apparatus 50A in that the common layer 114 is not included and a buffer layer 184 and a buffer layer 194 are included. The buffer layer 184 and the buffer layer 194 may each have a single-layer structure or a stacked-layer structure.

In the display apparatus 50C, the light-receiving device 110 includes the pixel electrode 111, the common layer 112, the photoelectric conversion layer 113, the buffer layer 184, and the common electrode 115. In the display apparatus 50C, the light-emitting device 190 includes the pixel electrode 191, the common layer 112, the light-emitting layer 193, the buffer layer 194, and the common electrode 115.

An example is shown in which in the display apparatus 50C, the buffer layer 184 between the common electrode 115 and the photoelectric conversion layer 113 and the buffer layer 194 between the common electrode 115 and the light-emitting layer 193 are formed separately. As each of the buffer layer 184 and the buffer layer 194, one or both of an electron-injection layer and an electron-transport layer can be formed, for example.

Figure 13A:
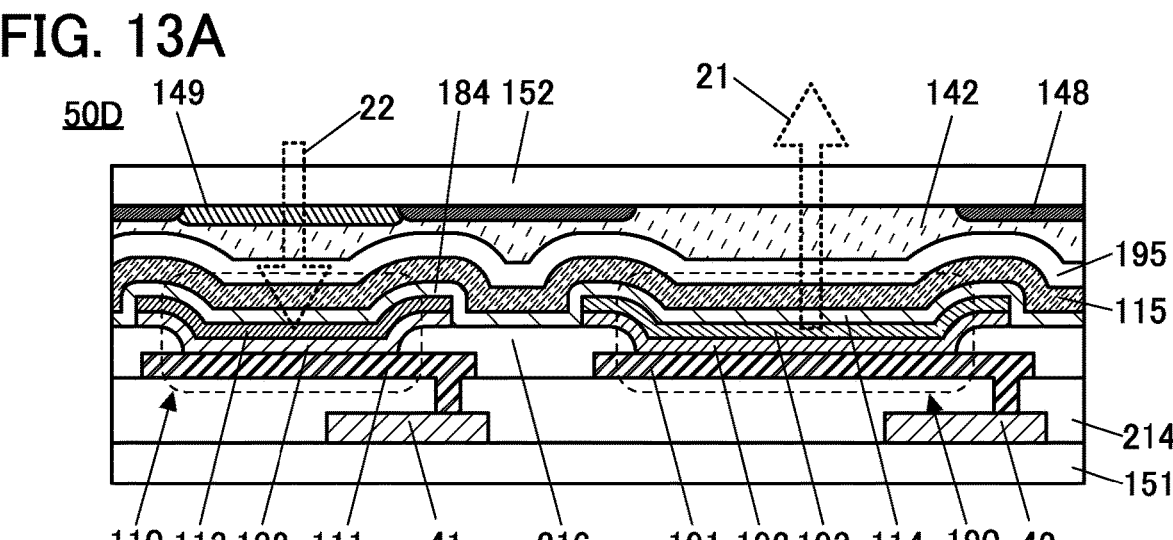
FIG. 13A and FIG. 13B are cross-sectional views each illustrating a display apparatus.

FIG. 13A is a schematic cross-sectional view of the display apparatus 50D. The display apparatus 50D differs from the display apparatus 50A in that the common layer 112 is not included and a buffer layer 182 and a buffer layer 192 are included. The buffer layer 182 and the buffer layer 192 may each have a single-layer structure or a stacked-layer structure.

In the display apparatus 50D, the light-receiving device 110 includes the pixel electrode 111, the buffer layer 182, the photoelectric conversion layer 113, the common layer 114, and the common electrode 115. In the display apparatus 50D, the light-emitting device 190 includes the pixel electrode 191, the buffer layer 192, the light-emitting layer 193, the common layer 114, and the common electrode 115.

An example is shown in which in the display apparatus 50D, the buffer layer 182 between the pixel electrode 111 and the photoelectric conversion layer 113 and the buffer layer 192 between the pixel electrode 191 and the light-emitting layer 193 are formed separately. As each of the buffer layer 182 and the buffer layer 192, one or both of a hole-injection layer and a hole-transport layer can be formed, for example.

Figure 13B:
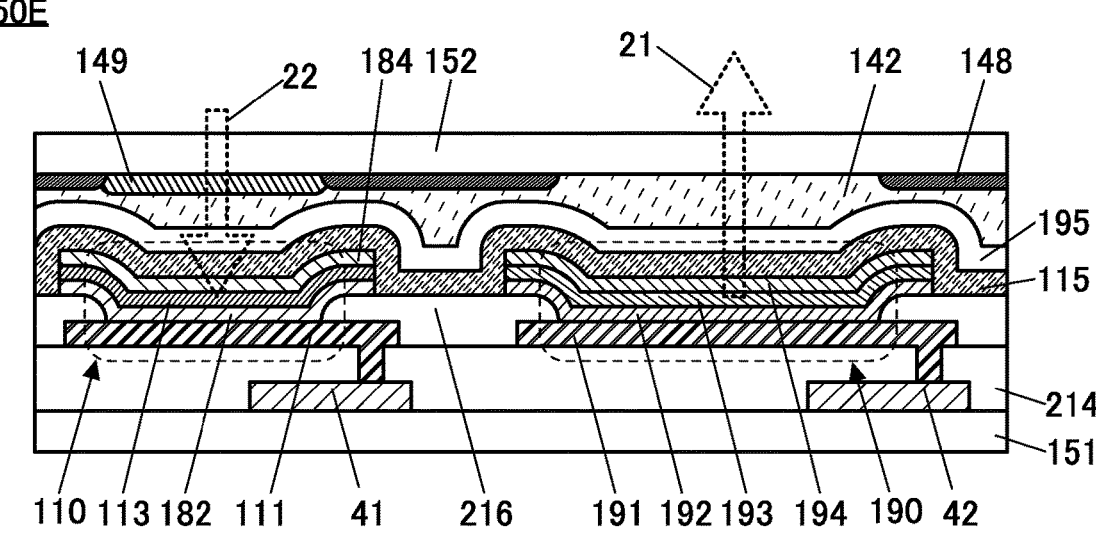

FIG. 13B is a schematic cross-sectional view of the display apparatus 50E. The display apparatus 50E differs from the display apparatus 50A in that the common layer 112 and the common layer 114 are not included and the buffer layer 182, the buffer layer 184, the buffer layer 192, and buffer layer 194 are included.

In the display apparatus 50E, the light-receiving device 110 includes the pixel electrode 111, the buffer layer 182, the photoelectric conversion layer 113, the buffer layer 184, and the common electrode 115. In the display apparatus 50E, the light-emitting device 190 includes the pixel electrode 191, the buffer layer 192, the light-emitting layer 193, the buffer layer 194, and the common electrode 115.

Other layers as well as the photoelectric conversion layer 113 and the light-emitting layer 193 can be formed separately in the manufacturing process of the light-receiving device 110 and the light-emitting device 190.

An example is shown in which in the display apparatus 50E, the light-receiving device 110 and the light-emitting device 190 do not have a common layer between the pair of electrodes (the pixel electrode 111 or the pixel electrode 191 and the common electrode 115). In the manufacturing process of the light-receiving device 110 and the light-emitting device 190 included in the display apparatus 50E, first, the pixel electrode 111 and the pixel electrode 191 are formed over the insulating layer 214 using the same material in the same step. Then, the buffer layer 182, the photoelectric conversion layer 113, and the buffer layer 184 are formed over the pixel electrode 111; the buffer layer 192, the light-emitting layer 193, and the buffer layer 194 are formed over the pixel electrode 191; and the common electrode 115 is formed so as to cover the buffer layer 184, the buffer layer 194, and the like.

Note that there is no particular limitation on the manufacturing order of the stacked-layer structure of the buffer layer 182, the photoelectric conversion layer 113, and the buffer layer 184 and the stacked-layer structure of the buffer layer 192, the light-emitting layer 193, and the buffer layer 194. For example, after the buffer layer 182, the photoelectric conversion layer 113, and the buffer layer 184 are deposited, the buffer layer 192, the light-emitting layer 193, and the buffer layer 194 may be formed. In contrast, the buffer layer 192, the light-emitting layer 193, and the buffer layer 194 may be formed before the buffer layer 182, the photoelectric conversion layer 113, and the buffer layer 184 are deposited. Alternatively, alternate deposition of the buffer layer 182, the buffer layer 192, the photoelectric conversion layer 113, the light-emitting layer 193, and the like in this order may be performed.

A more specific structure example of the display apparatus of one embodiment of the present invention will be described below.

Figure 14:
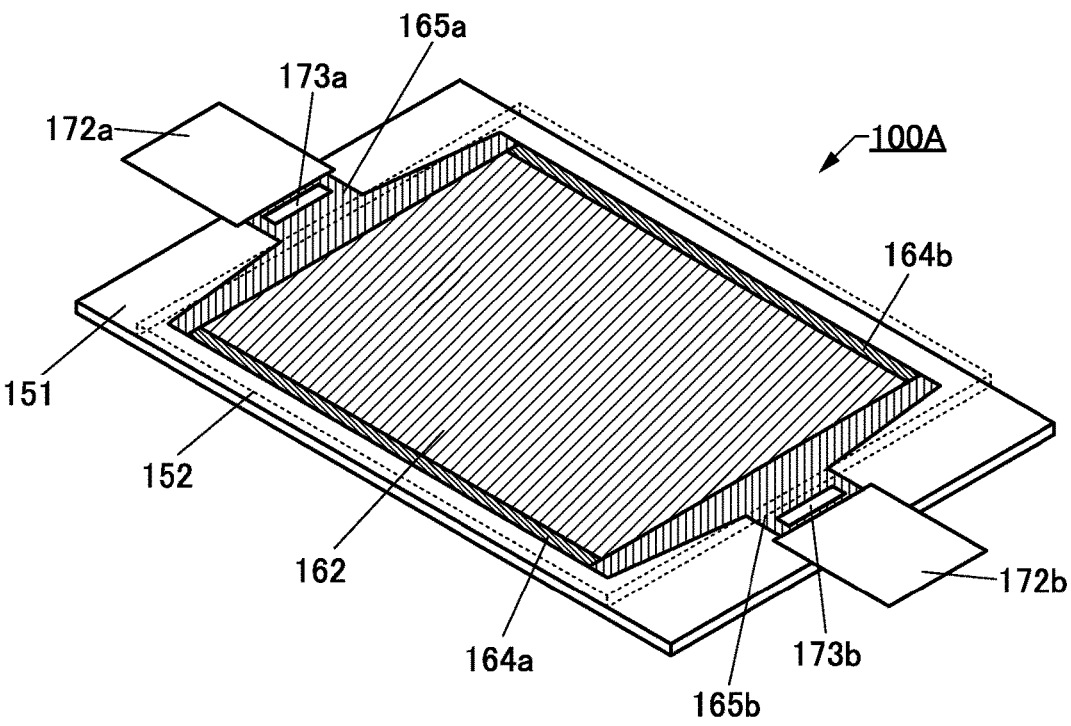
FIG. 14 is a perspective view illustrating a display apparatus.

FIG. 14 shows a perspective view of a display apparatus 100A. The display apparatus 100A has a structure in which the substrate 151 and the substrate 152 are bonded to each other. In FIG. 14, the substrate 152 is denoted by a dashed line.

The display apparatus 100A includes a display portion 162, a circuit 164a, a circuit 164b, a wiring 165a, a wiring 165b, and the like. FIG. 14 shows an example in which an IC (integrated circuit) 173a, an FPC 172a, an IC 173b, and an FPC 172b are mounted on the display apparatus 100A. Therefore, the structure illustrated in FIG. 14 can be regarded as a display module including the display apparatus 100A, the ICs, and the FPCs.

A gate driver for performing display can be used as the circuit 164a. A row driver for performing image capturing (light detection) can be used as the circuit 164b.

The wiring 165a has a function of supplying a signal and power to the subpixels 11 and 12 and the circuit 164a. The signal and the power are input to the wiring 165a from the outside through the FPC 172a or input to the wiring 165a from the IC 173a.

The wiring 165b has a function of supplying a signal and power to the subpixel 12 and the circuit 164b. The signal and the power are input to the wiring 165b from the outside through the FPC 172b or input to the wiring 165b from the IC 173b.

Although FIG. 14 shows an example in which the ICs 173a and 173b are provided on the substrate 151 by a COG (Chip On Glass) method, a TCP (Tape Carrier Package) method, a COF (Chip On Film) method, or the like may be used. An IC having a function of a source driver connected to the subpixels 11 and 12 can be used as the IC 173a, for example. An IC having functions of a column driver connected to the subpixel 12 and a signal processing circuit such as an A/D converter can be used as the IC 173b, for example.

Note that the driver circuits may be provided over the substrate 151 as well as the transistor included in the circuit of the pixel and the like.

Figure 15:
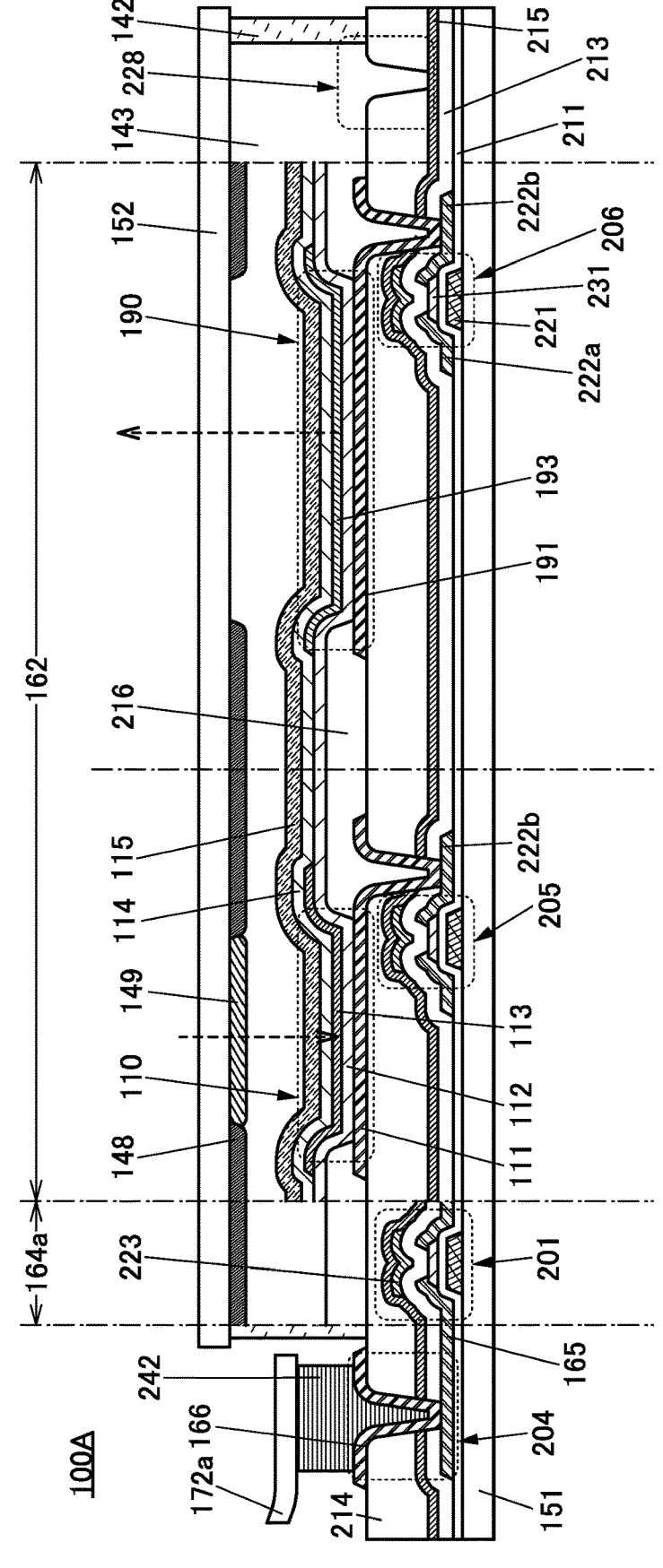
FIG. 15 is a cross-sectional view illustrating a display apparatus.

FIG. 15 shows an example of cross sections of part of a region including the FPC 172a, part of a region including the circuit 164a, part of a region including the display portion 162, and part of a region including an end portion in the display apparatus 100A shown in FIG. 14.

The display apparatus 100A shown in FIG. 15 includes a transistor 201, a transistor 205, a transistor 206, the light-emitting device 190, the light-receiving device 110, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting device 190 and the light-receiving device 110. A hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap with the light-emitting device 190. The region surrounded by the substrate 152, the adhesive layer 142, and the insulating layer 214 may be filled with a resin different from that of the adhesive layer 142.

The light-emitting device 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214. The transistor 206 has a function of controlling the driving of the light-emitting device 190. An end portion of the pixel electrode 191 is covered with the partition 216.

The light-receiving device 110 has a stacked-layer structure in which the pixel electrode 111, the common layer 112, the photoelectric conversion layer 113, the common layer 114, and the common electrode 115 are stacked in that order from the insulating layer 214 side. The pixel electrode 111 is electrically connected to the conductive layer 222b included in the transistor 205 through an opening provided in the insulating layer 214. An end portion of the pixel electrode 111 is covered with the partition 216.

Light emitted by the light-emitting device 190 is emitted to the substrate 152 side. Light enters the light-receiving device 110 through the substrate 152 and the space 143. For the substrate 152, a material having a high transmitting property with respect to visible light and infrared light is preferably used.

The pixel electrode 111 and the pixel electrode 191 can be formed using the same material in the same step. The common layer 112, the common layer 114, and the common electrode 115 are used in both the light-receiving device 110 and the light-emitting device 190. The light-receiving device 110 and the light-emitting device 190 can have common structures except the photoelectric conversion layer 113 and the light-emitting layer 193. Thus, the light-receiving device 110 can be incorporated into the display apparatus 100A without a significant increase in the number of manufacturing steps.

The light-blocking layer 148 is provided on a surface of the substrate 152 on the substrate 151 side. The light-blocking layer 148 has openings in a position overlapping with the light-receiving device 110 and in a position overlapping with the light-emitting device 190. The filter 149 that filters out ultraviolet light is provided in a position overlapping with the light-receiving device 110. Note that a structure without the filter 149 can be employed.

The transistor 201, the transistor 205, and the transistor 206 are formed over the substrate 151. These transistors can be manufactured using the same materials in the same process.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistors are not limited, and a single layer or two or more layers may be employed.

A material through which impurities such as water and hydrogen do not easily diffuse is preferably used for at least one of the insulating layers that cover the transistors. Thus, such an insulating layer can function as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film may be used. A stack including two or more of the above insulating films may also be used.

An organic insulating film is suitable for the insulating layer 214 functioning as a planarization layer. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Here, an organic insulating film often has a lower barrier property against impurities than an inorganic insulating film. Therefore, the organic insulating film preferably has an opening in the vicinity of an end portion of the display apparatus 100A. This can inhibit diffusion of impurities from the end portion of the display apparatus 100A through the organic insulating film. Alternatively, the organic insulating film may be formed such that an end portion of the organic insulating film is positioned on the inner side compared to the end portion of the display apparatus 100A, to prevent the organic insulating film from being exposed at the end portion of the display apparatus 100A.

In a region 228 illustrated in FIG. 15, an opening is formed in the insulating layer 214. This can inhibit diffusion of impurities into the display portion 162 from the outside through the insulating layer 214 even when an organic insulating film is used as the insulating layer 214. Thus, the reliability of the display apparatus 100A can be increased.

The transistor 201, the transistor 205, and the transistor 206 each include a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or bottom-gate transistor structure may be employed. Alternatively, gates may be provided above and below a semiconductor layer where a channel is formed.

A structure in which the semiconductor layer where a channel is formed is sandwiched between the two gates is used for the transistor 201, the transistor 205, and the transistor 206. The two gates may be connected to each other and supplied with the same signal to operate the transistor. Alternatively, one of the two gates may be supplied with a potential for controlling the threshold voltage of the transistor and the other may be supplied with a potential for driving.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable that a single crystal semiconductor or a semiconductor having crystallinity be used, in which case deterioration of the transistor characteristics can be inhibited.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where an In—M—Zn oxide is deposited by a sputtering method, the atomic proportion of In is preferably higher than or equal to the atomic proportion of M in a sputtering target. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the circuit 164a and the transistors included in the display portion 162 may have the same structure or different structures. One structure or two or more kinds of structures may be employed for a plurality of transistors included in the circuit 164a. Similarly, one structure or two or more kinds of structures may be employed for a plurality of transistors included in the display portion 162.

A connection portion 204 is provided in a region that is over the substrate 151 and does not overlap with the substrate 152. In the connection portion 204, the wiring 165 is electrically connected to the FPC 172a through a conductive layer 166 and a connection layer 242. On a top surface of the connection portion 204, the conductive layer 166 obtained by processing the same conductive film as the pixel electrode 191 is exposed. Thus, the connection portion 204 and the FPC 172a can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorption layer, or the like may be arranged on the outside of the substrate 152.

Glass, quartz, ceramic, sapphire, a resin, or the like can be used for the substrate 151 and the substrate 152.

For the adhesive layer, any of a variety of curable adhesives, e.g., a photocurable adhesive such as an ultraviolet curable adhesive, a reactive curable adhesive, a thermosetting adhesive, and an anaerobic adhesive, can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting device 190 may be of a top emission type, a bottom emission type, a dual emission type, or the like. Although the light-emitting device 190 is preferably of a top emission type in one embodiment of the present invention, another structure can be used when a light-emitting surface of the light-emitting device 190 and a light incident surface of the light-receiving device 110 face in the same direction.

The light-emitting device 190 includes at least the light-emitting layer 193. In addition to the light-emitting layer 193, the light-emitting device 190 may further include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114, and an inorganic compound may be contained. The layers included in the common layer 112, the light-emitting layer 193, and the common layer 114 can be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The photoelectric conversion layer 113 of the light-receiving device 110 contains a semiconductor. As the semiconductor, an inorganic semiconductor such as silicon or an organic semiconductor containing an organic compound can be used. This embodiment shows an example in which an organic semiconductor is used as the semiconductor included in the photoelectric conversion layer 113. The use of an organic semiconductor is preferable because the light-emitting layer 193 of the light-emitting device 190 and the photoelectric conversion layer 113 of the light-receiving device 110 can be formed by the same method (e.g., a vacuum evaporation method) and thus the same manufacturing apparatus can be used.

Examples of an n-type semiconductor material included in the photoelectric conversion layer 113 include electron-accepting organic semiconductor materials such as fullerene (e.g., $C_{60}$ and $C_{70}$) and derivatives thereof. Examples of a p-type semiconductor material included in the photoelectric conversion layer 113 include an electron-donating organic semiconductor material such as copper(II) phthalocyanine (CuPc), tetraphenyldibenzoperiflanthene (DBP), or zinc phthalocyanine (ZnPc).

For example, the photoelectric conversion layer 113 can be formed by co-evaporation of an n-type semiconductor and a p-type semiconductor.

As examples of materials that can be used for conductive layers such as a variety of wirings and electrodes that constitute the display apparatus, in addition to a gate, a source, and a drain of a transistor, metals such as aluminum, titanium, chromium, nickel, copper, yttrium, zirconium, molybdenum, silver, tantalum, or tungsten, or an alloy containing any of these metals as its main component can be given. A film containing any of these materials can be used as a single-layer structure or a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to allow light transmission. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers such as a variety of wirings and electrodes that constitute the display apparatus, and conductive layers (conductive layers functioning as a pixel electrode or a common electrode) included in the display element.

Examples of an insulating material that can be used for each insulating layer include a resin such as an acrylic resin or an epoxy resin and an inorganic insulating material such as silicon oxide, silicon oxynitride, silicon nitride oxide, silicon nitride, or aluminum oxide.

Figures 16A, 16B:
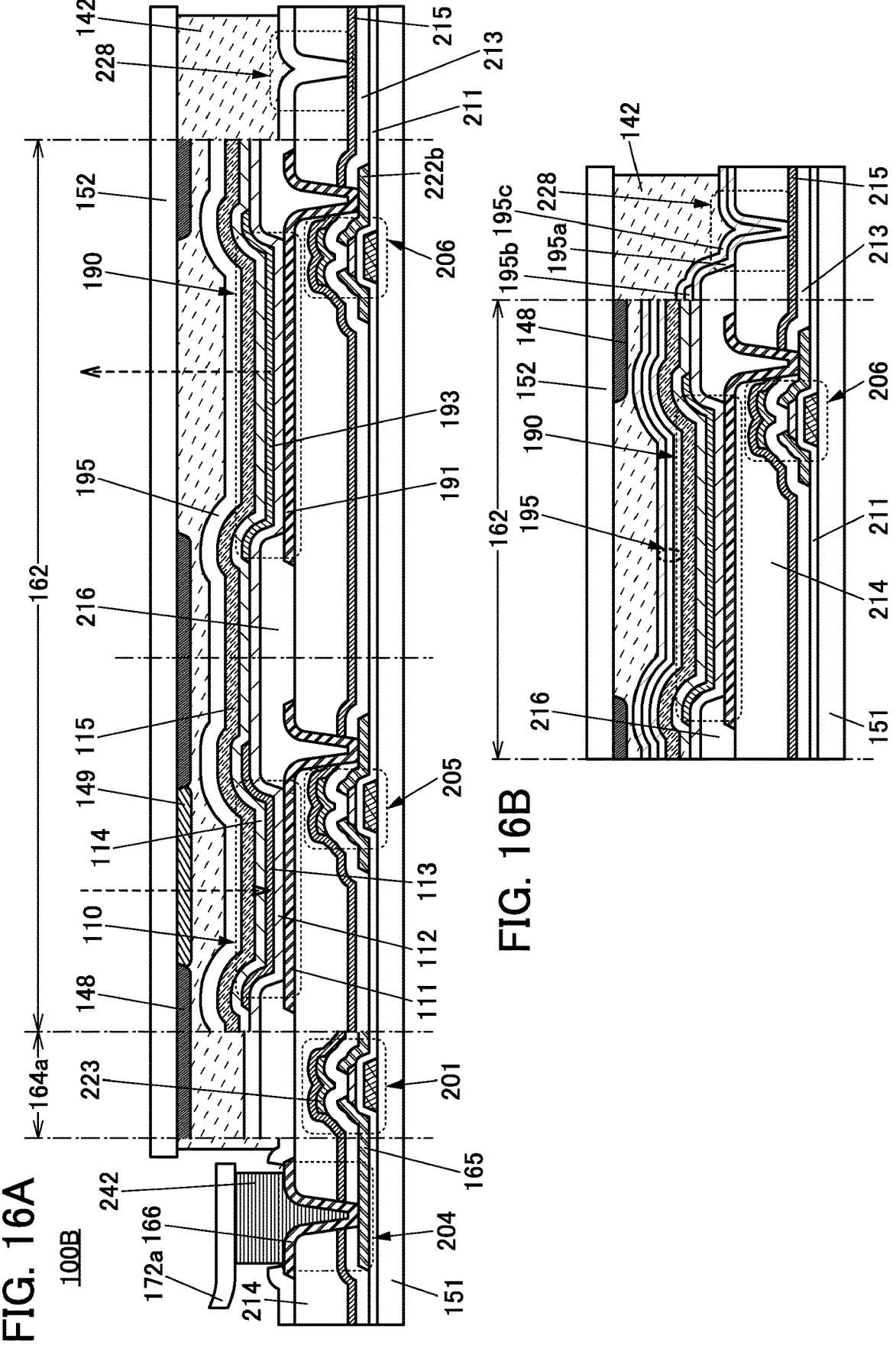
FIG. 16A and FIG. 16B are cross-sectional views illustrating a display apparatus.

FIG. 16A shows a cross-sectional view of a display apparatus 100B. The display apparatus 100B differs from the display apparatus 100A mainly in that the protective layer 195 is included.

Providing the protective layer 195 that covers the light-receiving device 110 and the light-emitting device 190 can inhibit diffusion of impurities such as water into the light-receiving device 110 and the light-emitting device 190, thereby increasing the reliability of the light-receiving device 110 and the light-emitting device 190.

In the region 228 in the vicinity of an end portion of the display apparatus 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, diffusion of impurities from the outside into the display portion 162 through the organic insulating film can be inhibited. Thus, the reliability of the display apparatus 100B can be increased.

FIG. 16B shows an example in which the protective layer 195 has a three-layer structure. The protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving device 110 and the light-emitting device 190 can be surrounded by the insulating layer 215 and the protective layer 195, whereby the reliability of the light-receiving device 110 and the light-emitting device 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

In the display apparatus 100B, the protective layer 195 and the substrate 152 are bonded to each other with the adhesive layer 142. The adhesive layer 142 is provided to overlap with the light-receiving device 110 and the light-emitting device 190; that is, the display apparatus 100B employs a solid sealing structure.

Figures 17A, 17B:
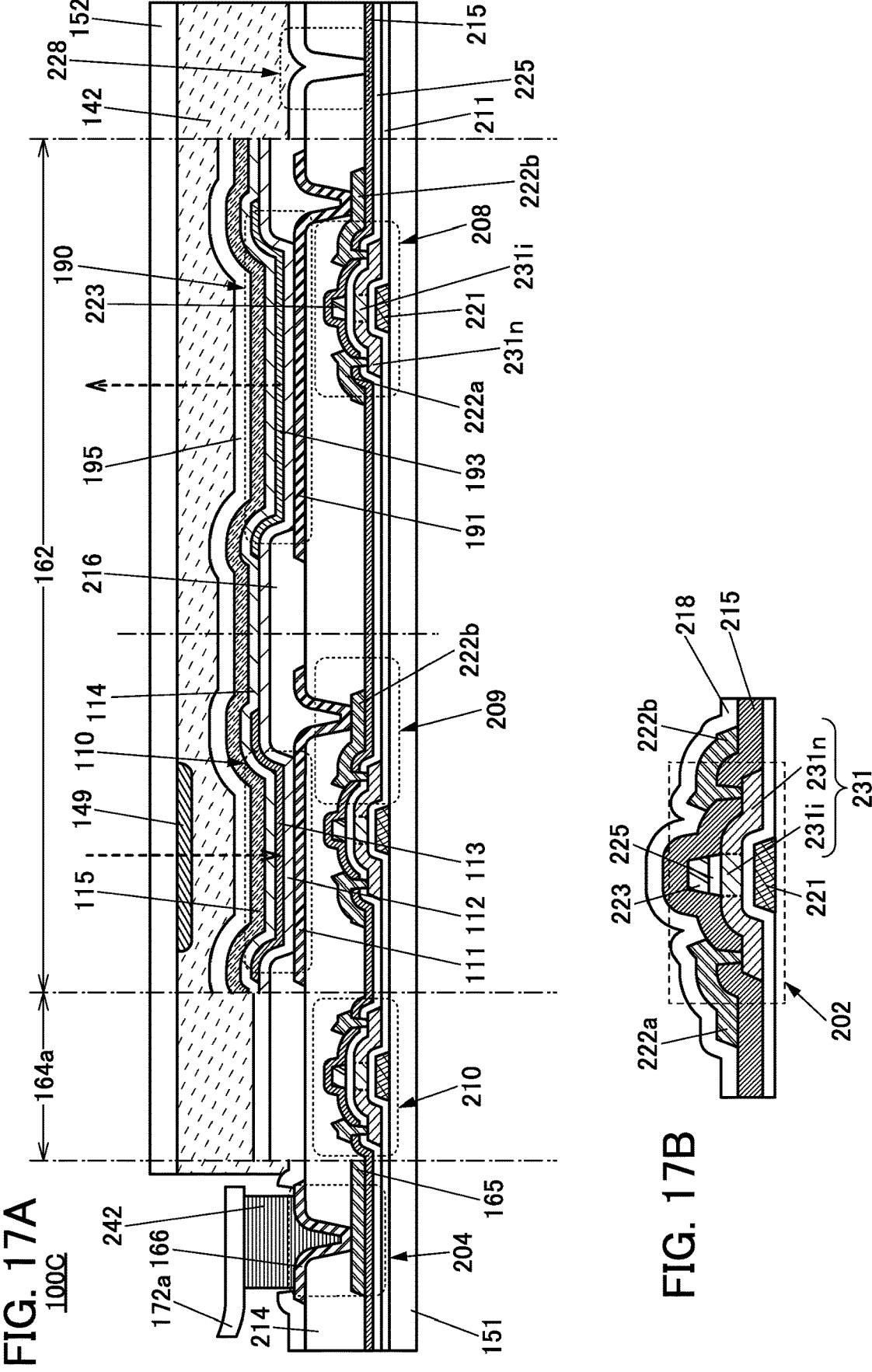
FIG. 17A is a cross-sectional view illustrating a display apparatus.
FIG. 17B is a cross-sectional view illustrating a transistor.

FIG. 17A shows a cross-sectional view of a display apparatus 100C. The display apparatus 100C differs from the display apparatus 100B mainly in the structure of transistors and in not including the light-blocking layer 148.

The display apparatus 100C includes a transistor 208, a transistor 209, and a transistor 210 over the substrate 151.

The transistor 208, the transistor 209, and the transistor 210 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the respective low-resistance regions 231n through openings provided in the insulating layer 225 and the insulating layer 215. One of the conductive layer 222a and the conductive layer 222b functions as a source and the other functions as a drain.

The pixel electrode 191 of the light-emitting device 190 is electrically connected to one of the pair of low-resistance regions 231n of the transistor 208 through the conductive layer 222b.

The pixel electrode 111 of the light-receiving device 110 is electrically connected to the other of the pair of low-resistance regions 231n of the transistor 209 through the conductive layer 222b.

FIG. 17A shows an example in which the insulating layer 225 covers a top surface and a side surface of the semiconductor layer. FIG. 17B shows an example in which the insulating layer 225 overlaps with the channel formation region 231i of the semiconductor layer 231 and does not overlap with the low-resistance regions 231n. The structure shown in FIG. 17B can be manufactured by processing the insulating layer 225 using the conductive layer 223 as a mask, for example. In FIG. 17B, the insulating layer 215 is provided to cover the insulating layer 225 and the conductive layer 223, and the conductive layer 222a and the conductive layer 222b are connected to the low-resistance regions 231n through openings in the insulating layer 215. Furthermore, an insulating layer 218 covering the transistor may be provided.

Figure 18:
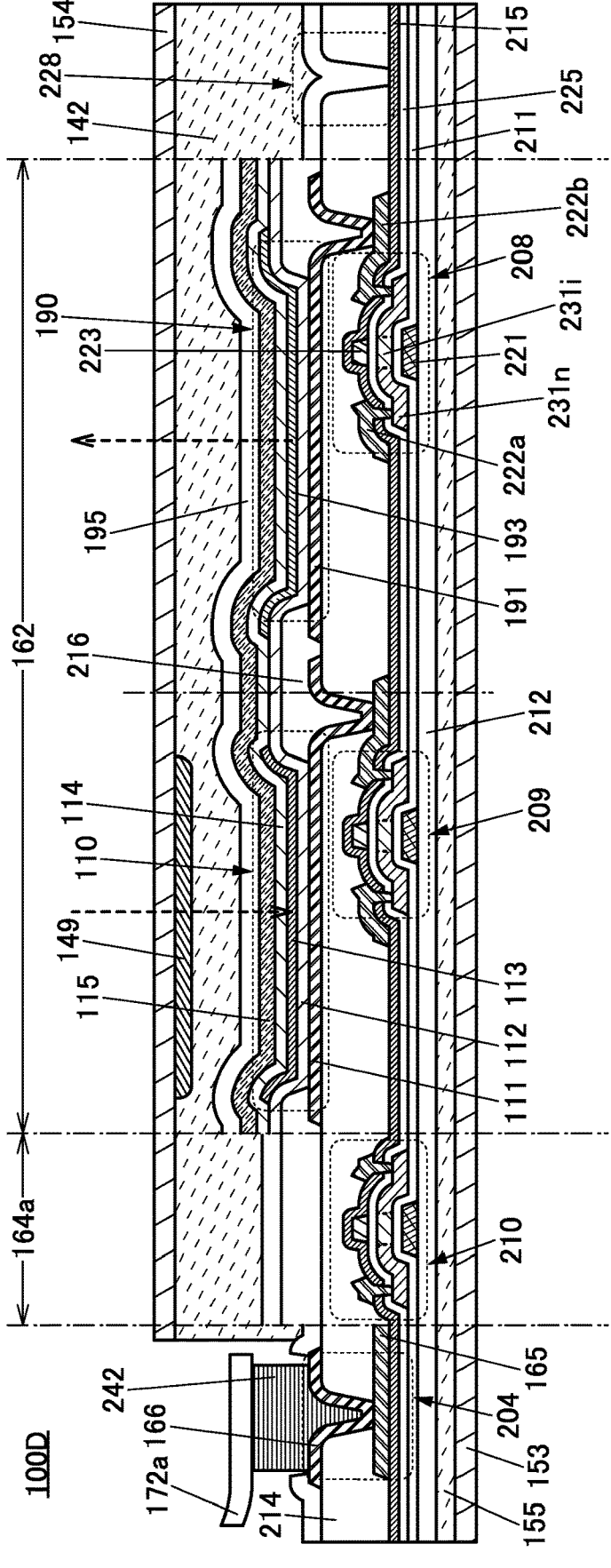
FIG. 18 is a cross-sectional view illustrating a display apparatus.

FIG. 18 shows a cross-sectional view of a display apparatus 100D. The display apparatus 100D differs from the display apparatus 100C mainly in the structure of the substrate.

The display apparatus 100D does not include the substrate 151 or the substrate 152 and includes the substrate 153, the substrate 154, the adhesive layer 155, and the insulating layer 212.

The substrate 153 and the insulating layer 212 are bonded to each other with the adhesive layer 155. The substrate 154 and the protective layer 195 are bonded to each other with the adhesive layer 142.

The display apparatus 100D has a structure formed by transferring, onto the substrate 153, the insulating layer 212, the transistor 208, the transistor 209, the light-receiving device 110, the light-emitting device 190, and the like that are formed over a formation substrate. The substrate 153 and the substrate 154 are preferably flexible. Accordingly, flexibility can be imparted to the display apparatus 100D.

The inorganic insulating film that can be used as the insulating layer 211, the insulating layer 213, and the insulating layer 215 can be used as the insulating layer 212. Alternatively, a stacked film of an organic insulating film and an inorganic insulating film may be used as the insulating layer 212. At this time, a film on the transistor 209 side is preferably an inorganic insulating film.

The above is the description of the structure example of the display apparatus.

The display apparatus of this embodiment includes a light-receiving device and a light-emitting device in a display portion, and the display portion has both a function of displaying an image and a function of detecting light. Thus, the size and weight of the electronic device can be reduced as compared to the case where a sensor is provided outside the display portion or outside the display apparatus. Moreover, the electronic device can have more functions by a combination of the display apparatus of this embodiment and a sensor provided outside the display portion or outside the display apparatus.

In the light-receiving device, at least one layer other than the photoelectric conversion layer can have a structure in common with the layer in the light-emitting device (the EL element). Furthermore, in the light-receiving device, all the layers other than the photoelectric conversion layer can have structures in common with the layers in the light-emitting device (EL element). With only the addition of the step of depositing the photoelectric conversion layer to the manufacturing process of the light-emitting device, the light-emitting device and the light-receiving device can be formed over one substrate, for example. In the light-receiving device and the light-emitting device, the pixel electrodes and the common electrode can be formed using the same material in the same step. When a circuit electrically connected to the light-receiving device and a circuit electrically connected to the light-emitting device are formed using the same material in the same process, the manufacturing process of the display apparatus can be simplified. In such a manner, a display apparatus that incorporates a light-receiving device and is highly convenient can be manufactured without complicated steps.

A metal oxide that can be used in the semiconductor layer of the transistor will be described below.

Note that in this specification and the like, a metal oxide containing nitrogen is also referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter, referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has lower crystallinity than the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited by a sputtering method using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The transistor including the metal oxide can exhibit characteristics with an extremely low off-state current of several yoctoamperes per micrometer (a current value per micrometer of a channel width). A transistor including a metal oxide has features such that impact ionization, an avalanche breakdown, a short-channel effect, or the like does not occur, which are different from those of a transistor including Si. Thus, the use of the transistor enables formation of a highly reliable circuit. Moreover, variations in electrical characteristics due to crystallinity unevenness, which are caused in transistors including Si, are less likely to occur in the transistors including a metal oxide.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature, in which case productivity can be increased.

The metal oxide film can be formed by a sputtering method, a PLD method, a PECVD method, a thermal CVD method, an MOCVD method, an ALD method, a vacuum evaporation method, or the like.

The above is the description of the metal oxide.

At least part of this embodiment can be implemented in combination with the other embodiments described in this specification as appropriate.

Embodiment 2

In this embodiment, a circuit of a pixel included in a display apparatus of one embodiment of the present invention will be described.

The pixel of the display apparatus of one embodiment of the present invention includes the subpixel 11, the subpixel 12, and the subpixel 13. A pixel circuit of the subpixel 11 includes a display device that emits visible light. A pixel circuit of the subpixel 12 includes a light-emitting device that emits infrared light. A pixel circuit of the subpixel 13 includes a light-receiving device.

Figure 19A:
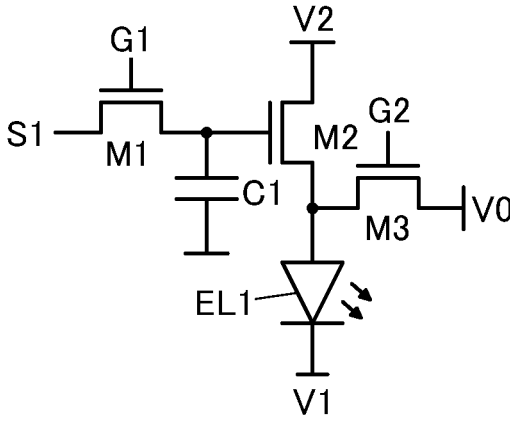
FIG. 19A to FIG. 19D are diagrams each illustrating a circuit of a pixel.

FIG. 19A shows an example of a pixel circuit PIX1 that can be used for the subpixel 11 and the subpixel 12. The pixel circuit PIX1 includes a light-emitting device EL1, a transistor M1, a transistor M2, a transistor M3, and a capacitor C1. Here, an example in which a light-emitting diode is used as the light-emitting device EL1 is shown. An organic EL element that emits visible light or an organic EL element that emits infrared light is preferably used as the light-emitting device EL1.

A gate of the transistor M1 is electrically connected to a wiring G1, one of a source and a drain of the transistor M1 is electrically connected to a wiring S1, and the other of the source and the drain of the transistor M1 is electrically connected to one electrode of the capacitor C1 and a gate of the transistor M2. One of a source and a drain of the transistor M2 is electrically connected to a wiring V2, and the other is electrically connected to an anode of the light-emitting device EL1 and one of a source and a drain of the transistor M3. A gate of the transistor M3 is electrically connected to a wiring G2, and the other of the source and the drain of the transistor M3 is electrically connected to a wiring V0. A cathode of the light-emitting device EL1 is electrically connected to a wiring V1.

A constant potential is supplied to each of the wiring V1 and the wiring V2. Light emission can be performed when the anode side of the light-emitting device EL1 is set to a high potential and the cathode side is set to a low potential. The transistor M1 is controlled by a signal supplied to the wiring G1 and functions as a selection transistor for controlling a selection state of the pixel circuit PIX1. The transistor M2 functions as a driving transistor that controls a current flowing through the light-emitting device EL1 in accordance with a potential supplied to the gate.

When the transistor M1 is in a conduction state, a potential supplied to the wiring S1 is supplied to the gate of the transistor M2, and the emission luminance of the light-emitting device EL1 can be controlled in accordance with the potential. The transistor M3 is controlled by a signal supplied to the wiring G2. Accordingly, a potential between the transistor M3 and the light-emitting device EL1 can be reset to a constant potential supplied from the wiring V0; thus, a potential can be written to the gate of the transistor M2 in the state where the source potential of the transistor M2 is stabilized.

Figure 19B:
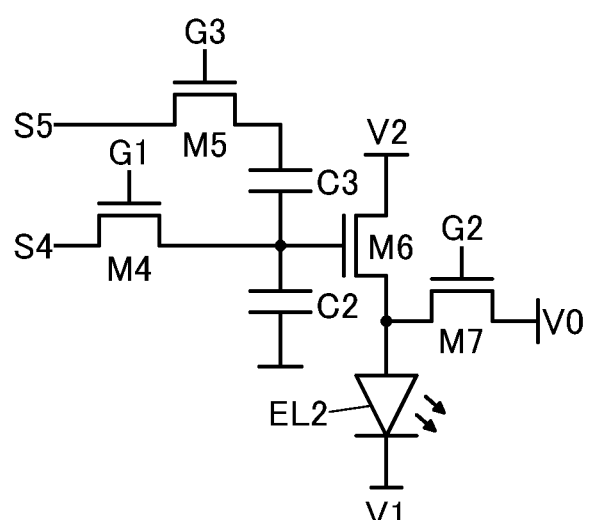

FIG. 19B shows an example of a pixel circuit PIX2 which is different from the pixel circuit PIX1. The pixel circuit PIX2 has a function of boosting a voltage. The pixel circuit PIX2 includes a light-emitting device EL2, a transistor M4, a transistor M5, a transistor M6, a transistor M7, a capacitor C2, and a capacitor C3. Here, an example in which a light-emitting diode is used as the light-emitting device EL2 is shown. The pixel circuit PIX2 can be used for all of the subpixels 11 (the subpixel 11R, the subpixel 11G, and the subpixel 11B) and the subpixel 12 included in the pixel 10. The pixel circuit PIX2 may be used for one or two of the subpixel 11R, the subpixel 11G, and the subpixel 11B.

A gate of the transistor M4 is electrically connected to the wiring G1, one of a source and a drain of the transistor M4 is electrically connected to a wiring S4, and the other of the source and the drain of the transistor M4 is electrically connected to one electrode of the capacitor C2, one electrode of the capacitor C3, and a gate of the transistor M6. A gate of the transistor M5 is electrically connected to a wiring G3, one of a source and a drain of the transistor M5 is electrically connected to a wiring S5, and the other of the source and the drain of the transistor M5 is electrically connected to the other electrode of the capacitor C3.

One of a source and a drain of the transistor M6 is electrically connected to the wiring V2, and the other is electrically connected to an anode of the light-emitting device EL2 and one of a source and a drain of the transistor M7. A gate of the transistor M7 is electrically connected to the wiring G2, and the other of the source and the drain of the transistor M7 is electrically connected to the wiring V0. A cathode of the light-emitting device EL2 is electrically connected to the wiring V1.

The transistor M4 is controlled by a signal supplied to the wiring G1, and the transistor M5 is controlled by a signal supplied to the wiring G3. The transistor M6 functions as a driving transistor that controls a current flowing through the light-emitting device EL2 in accordance with a potential supplied to the gate.

The emission luminance of the light-emitting device EL2 can be controlled in accordance with the potential supplied to the gate of the transistor M6. The transistor M7 is controlled by a signal supplied to the wiring G2. A potential between the transistor M6 and the light-emitting device EL2 can be reset to a constant potential supplied from the wiring V0; thus, a potential can be written to the gate of the transistor M6 in the state where the source potential of the transistor M6 is stabilized. In addition, when the potential supplied from the wiring V0 is set to the same potential as the potential of the wiring V1 or a potential lower than that of the wiring V1, light emission of the light-emitting device EL2 can be inhibited.

The function of boosting a voltage, which the pixel circuit PIX2 has, will be described below.

First, a potential "D1" of the wiring S4 is supplied to the gate of the transistor M6 through the transistor M4, and at timing overlapping with this, a reference potential "$V_{ref}$" is supplied to the other electrode of the capacitor C3 through the transistor M5. At this time, "$D1–V_{ref}$" is stored in the capacitor C3. Next, the gate of the transistor M6 is set to be floating, and a potential "D2" of the wiring S5 is supplied to the other electrode of the capacitor C3 through the transistor M5. Here, the potential "D2" is a potential for addition.

At this time, the potential of the gate of the transistor M6 is $D1+(C_3/(C_3+C_2+C_{M6}))×(D2–V_{ref})$, where $C_3$ is the capacitance value of the capacitor C3, $C_2$ is the capacitance value of the capacitor C2, and $C_{M6}$ is the capacitance value of the gate of the transistor M6. Here, assuming that the value of $C_3$ is sufficiently larger than the value of $C_2+C_{M6}$, $C_3/(C_3+C_2+C_{M6})$ approximates 1. Thus, it can be said that the potential of the gate of the transistor M6 approximates "$D1+(D2–V_{ref})$". Then, when D1=D2 and $V_{ref}$=0, "$D1+(D2–V_{ref})$"="2D1".

That is, when the circuit is designed appropriately, a potential approximately twice as high as the potential that can be input from the wiring S4 or S5 can be supplied to the gate of the transistor M6.

Owing to such an action, a high voltage can be generated even when a general-purpose driver IC is used. Thus, the voltage to be input can be low and power consumption can be reduced.

Figure 19C:
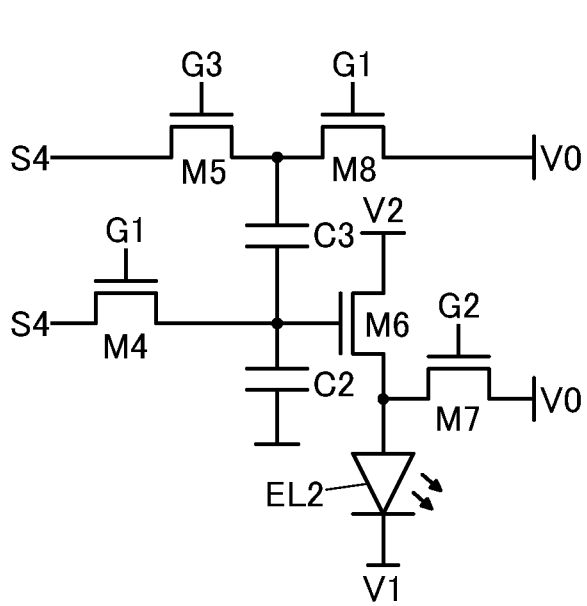

Alternatively, the pixel circuit PIX2 may have a structure shown in FIG. 19C. The pixel circuit PIX2 shown in FIG. 19C differs from the pixel circuit PIX2 shown in FIG. 19B in including a transistor M8. A gate of the transistor M8 is electrically connected to the wiring G1, one of a source and a drain is electrically connected to the other of the source and the drain of the transistor M5 and the other electrode of the capacitor C3, and the other of the source and the drain is electrically connected to the wiring V0. The one of the source and the drain of the transistor M5 is connected to the wiring S4.

As described above, in the pixel circuit PIX2 shown in FIG. 19B, the operation of supplying the reference potential and the potential for addition to the other electrode of the capacitor C3 through the transistor M5 is performed. In this case, the two wirings S4 and S5 are necessary and the reference potential and the potential for addition need to be rewritten alternately in the wiring S5.

In the pixel circuit PIX2 shown in FIG. 19C, although the transistor M8 is additionally provided, the wiring S5 can be omitted because a dedicated path for supplying the reference potential is provided. Furthermore, since the gate of the transistor M8 can be connected to the wiring G1 and the wiring V0 can be used as a wiring for supplying the reference potential, a wiring connected to the transistor M8 is not additionally provided. Moreover, alternate rewriting of the reference potential and the potential for addition is not performed in one wiring, which makes it possible to achieve high-speed operation with low power consumption.

Note that in FIG. 19B and FIG. 19C, "D1B", an inversion potential of "D1", may be used as the reference potential "$V_{ref}$". In this case, a potential approximately three times as high as the potential that can be input from the wiring S4 or S5 can be supplied to the gate of the transistor M6. Note that the inversion potential refers to a potential such that the absolute value of the difference between the potential and a reference potential is the same (or substantially the same) as that of the difference between the original potential and the reference potential, and the potential is different from the original potential. The relation $V_0=(D1+D1B)/2$ needs to be satisfied, where "D1" is the original potential, "D1B" is the inversion potential, and $V_0$ is the reference potential.

In the display apparatus of this embodiment, the light-emitting device may be made to emit light in a pulsed manner so as to display an image. A reduction in the driving time of the light-emitting device can reduce power consumption of the display apparatus and inhibit heat generation. An organic EL element is particularly preferable because of its favorable frequency characteristics. The frequency can be greater than or equal to 1 kHz and less than or equal to 100 MHz, for example.

Figure 19D:
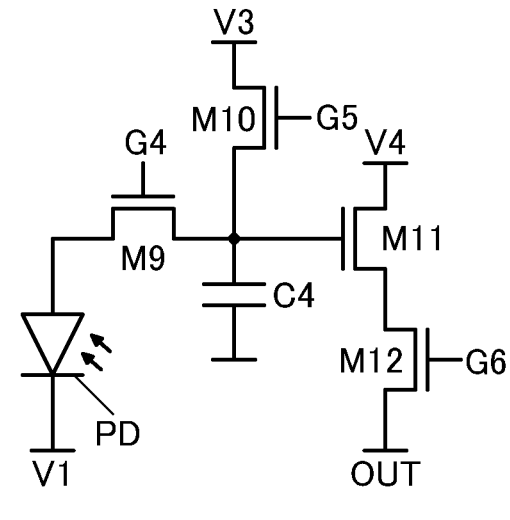

FIG. 19D shows an example of the pixel circuit PIX3 of the subpixel 13. The pixel circuit PIX3 includes a light-receiving device PD, a transistor M9, a transistor M10, a transistor M11, a transistor M12, and a capacitor C4. Here, an example in which a photodiode is used as the light-receiving device PD is shown.

A cathode of the light-receiving device PD is electrically connected to the wiring V1, and an anode thereof is electrically connected to one of a source and a drain of the transistor M9. A gate of the transistor M9 is electrically connected to a wiring G4, and the other of the source and the drain of the transistor M9 is electrically connected to one electrode of the capacitor C4, one of a source and a drain of the transistor M10, and a gate of the transistor M11. A gate of the transistor M10 is electrically connected to a wiring G5, and the other of the source and the drain of the transistor M10 is electrically connected to a wiring V3. One of a source and a drain of the transistor M11 is electrically connected to a wiring V4, and the other of the source and the drain of the transistor M11 is electrically connected to one of a source and a drain of the transistor M12. A gate of the transistor M12 is electrically connected to a wiring G6, and the other of the source and the drain of the transistor M12 is electrically connected to a wiring OUT.

A constant potential is supplied to each of the wiring V1, the wiring V3, and the wiring V4. When the light-receiving device PD is driven with a reverse bias, a potential lower than the potential of the wiring V1 is supplied to the wiring V3. The transistor M10 is controlled by a signal supplied to the wiring G5 and has a function of resetting the potential of a node connected to the gate of the transistor M11 to a potential supplied to the wiring V3. The transistor M9 is controlled by a signal supplied to the wiring G4 and has a function of controlling the timing at which the potential of the node changes, in accordance with a current flowing through the light-receiving device PD. The transistor M11 functions as an amplifier transistor that performs output responsive to the potential of the node. The transistor M12 is controlled by a signal supplied to the wiring G6 and functions as a selection transistor for reading the output responsive to the potential of the node by an external circuit connected to the wiring OUT.

Here, it is preferable to use, as each of the transistors M1 to M12 included in the pixel circuits PIX1 to PIX3, a transistor including a metal oxide (an oxide semiconductor) in a semiconductor layer where a channel is formed.

A transistor including a metal oxide having a wider band gap and a lower carrier density than silicon can achieve an extremely low off-state current. Such a low off-state current enables retention of charge accumulated in a capacitor that is connected in series with the transistor for a long time.

Therefore, it is preferable to use transistors including an oxide semiconductor particularly as the transistor M1, the transistor M4, the transistor M5, the transistor M8, the transistor M9, and the transistor M10, in each of which one or the other of the source and the drain is connected to the capacitor C1, the capacitor C2, the capacitor C3, or the capacitor C4. With the use of transistors including an oxide semiconductor in the subpixel 13, a global shutter system, in which all the pixels perform operation of accumulating charge at the same time, can be used without complicated circuit structures and driving methods.

Moreover, the use of transistors including an oxide semiconductor as the other transistors can reduce the manufacturing cost.

Alternatively, transistors using silicon as a semiconductor in which a channel is formed can be used as the transistor M1 to the transistor M12. It is particularly preferable to use silicon with high crystallinity, such as single crystal silicon or polycrystalline silicon, to achieve high field-effect mobility and enable higher-speed operation.

Alternatively, a transistor including an oxide semiconductor may be used as at least one of the transistor M1 to the transistor M12, and transistors including silicon may be used as the other transistors. When a transistor including an oxide semiconductor is used as the transistor connected to a node storing data, data can be stored for a long time in the node. Thus, the number of times of writing data and the like can be reduced, enabling reduced power consumption of the display apparatus.

Although FIG. 19A to FIG. 19D each show an example in which n-channel transistors are used, p-channel transistors can also be used.

The transistors included in the pixel circuit PIX1, the transistors included in the pixel circuit PIX2, and the transistors included in the pixel circuit PIX3 are preferably formed side by side over the same substrate. In addition, of the wirings connected to the pixel circuits PIX1 to PIX3, wirings that are denoted by the same reference numeral in FIG. 19A to FIG. 19D may be a common wiring.

One or more layers including the transistor and/or the capacitor are preferably provided to overlap with the light-receiving device PD, the light-emitting device EL1, or the light-emitting device EL2. In this case, the effective occupied area of each pixel circuit can be reduced, and a high-definition light-receiving portion or display portion can be achieved.

Figure 20:
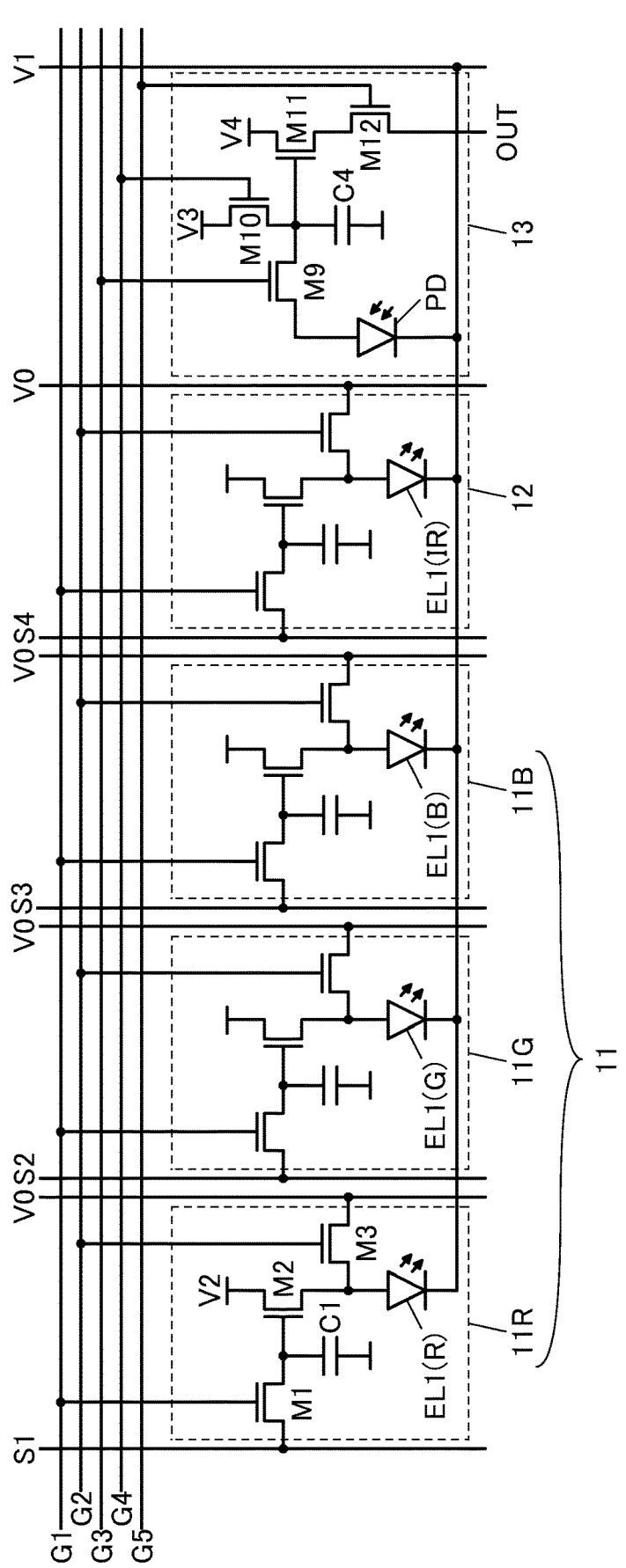
FIG. 20 is a diagram illustrating a circuit of a pixel.
Figure 21:
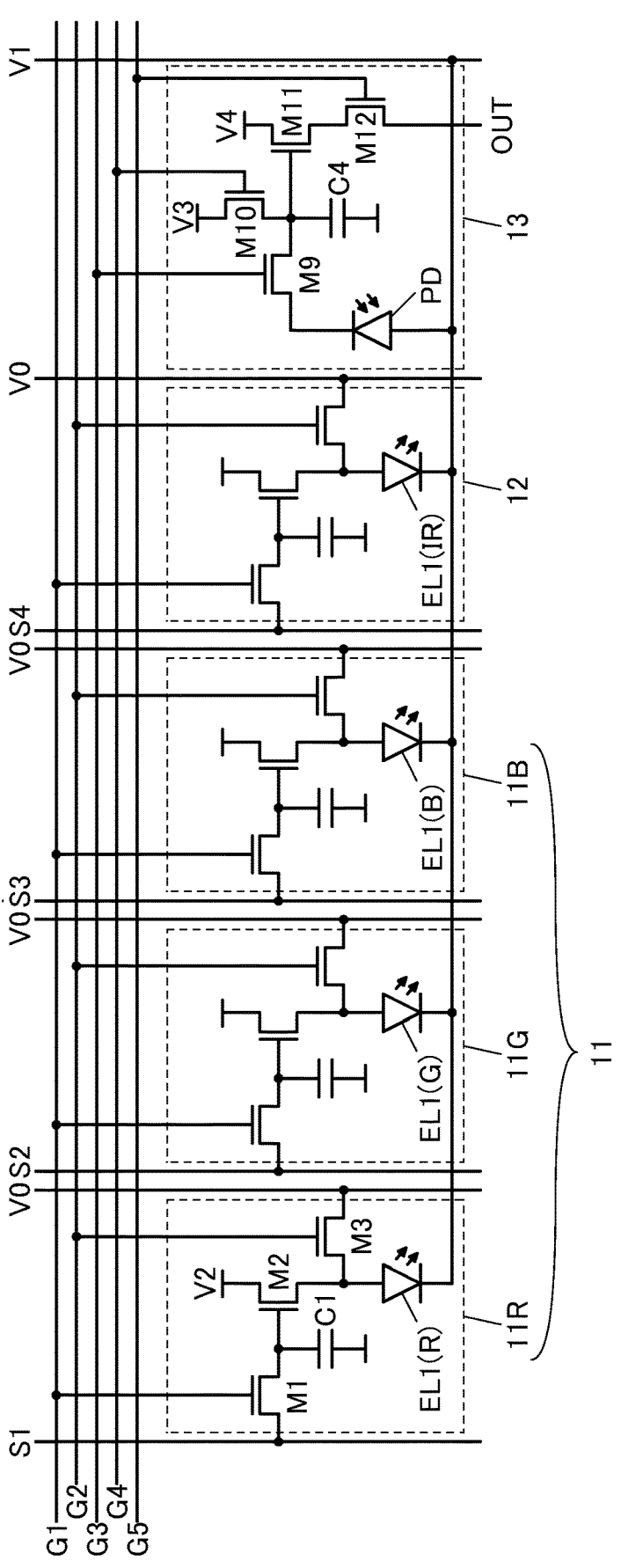
FIG. 21 is a diagram illustrating a circuit of a pixel.

FIG. 20 is an example of a circuit diagram of the subpixels 11 (the subpixel 11R, the subpixel 11G, and the subpixel 11B), the subpixel 12, and the subpixel 13 included in the pixel 10. The wiring G1 and the wiring G2 can be electrically connected to the gate driver (FIG. 5, the circuit 16). The wiring G3 to the wiring G5 can be electrically connected to the row driver (FIG. 5, the circuit 18). The wirings S1 to S4 can be electrically connected to the source driver (FIG. 5, the circuit 15). The wiring OUT can be electrically connected to the column driver (FIG. 5, the circuit 17) and the reading circuit (FIG. 5, the circuit 19).

A power supply circuit that supplies a constant potential can be electrically connected to the wirings V0 to V4, a low potential can be supplied to the wirings V0, V1, and V3, and a high potential can be supplied to the wirings V2 and V4. At this time, the wiring V3 can be supplied with a potential lower than the potential supplied to the wiring V1.

The anode of the light-receiving device PD in the subpixel 13 may be electrically connected to the wiring V1, and the other of the source and the drain of the transistor M10 may be electrically connected to the wiring V3, as shown in FIG.

21. At this time, the wiring V3 can be supplied with a potential higher than the potential supplied to the wiring V1.

In one embodiment of the present invention, a power supply line or the like can be shared by the subpixels 11, the subpixel 12, and the subpixel 13.

At least part of this embodiment can be implemented in combination with the other embodiments described in this specification as appropriate.

REFERENCE NUMERALS

C1: capacitor, C2: capacitor, C3: capacitor, C4: capacitor, G1: wiring, G2: wiring, G3: wiring, G4: wiring, G5: wiring, G6: wiring, M1: transistor, M2: transistor, M3: transistor, M4: transistor, M5: transistor, M6: transistor, M7: transistor, M8: transistor, M9: transistor, M10: transistor, M11: transistor, M12: transistor, P1: image, P2: image, P3: image, PIX1: pixel circuit, PIX2: pixel circuit, PIX3: pixel circuit, S1: wiring, S4: wiring, S5: wiring, V0: wiring, V1: wiring, V2: wiring, V3: wiring, V4: wiring, 10: pixel, 11: subpixel, 11B: subpixel, 11G: subpixel, 11R: subpixel, 11W: subpixel, 12: subpixel, 12E: light source, 13: subpixel, 14: pixel array, 15: circuit, 16: circuit, 17: circuit, 18: circuit, 19: circuit, 21: light, 22: light, 23: light, 23a: light, 23b: reflected light, 23c: light, 23d: reflected light, 30: electronic device, 31: display apparatus, 41: transistor, 42: transistor, 50A: display apparatus, 50B: display apparatus, 50C: display apparatus, 50D: display apparatus, 50E: display apparatus, 61: display portion, 62: housing, 63: camera, 64: optical sensor, 65: power supply button, 66: button, 67: speaker, 68: microphone, 69: light source, 71: icon, 72: pointer, 81: pointing object, 82: light source, 83: shadow, 84: deep portion, 87: sensor, 90: region, 91: region, 92: dark portion, 93: bright portion, 95: region, 96: region, 97: bright portion, 98: dark portion, 100A: display apparatus, 100B: display apparatus, 100C: display apparatus, 100D: display apparatus, 110: light-receiving device, 111: pixel electrode, 112: common layer, 113: photoelectric conversion layer, 114: common layer, 115: common electrode, 142: adhesive layer, 143: space, 148: light-blocking layer, 149: filter, 151: substrate, 152: substrate, 153: substrate, 154: substrate, 155: adhesive layer, 162: display portion, 164a: circuit, 164b: circuit, 165: wiring, 165a: wiring, 165b: wiring, 166: conductive layer, 172a: FPC, 172b: FPC, 173a: IC, 173b: IC, 180: display device, 182: buffer layer, 183: light-emitting layer, 184: buffer layer, 190: light-emitting device, 191: pixel electrode, 192: buffer layer, 193: light-emitting layer, 194: buffer layer, 195: protective layer, 195a: inorganic insulating layer, 195b: organic insulating layer, 195c: inorganic insulating layer, 201: transistor, 204: connection portion, 205: transistor, 206: transistor, 208: transistor, 209: transistor, 210: transistor, 211: insulating layer, 212: insulating layer, 213: insulating layer, 214: insulating layer, 215: insulating layer, 216: partition, 217: partition, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 242: connection layer

The invention claimed is:

1. A display apparatus comprising a plurality of light-emitting devices and a plurality of light-receiving devices in a display portion, wherein the display apparatus has a first operational configuration that irradiates no light from the light-emitting devices and detects, with the light-receiving devices, light attenuated by being blocked by a pointing object over the display portion to recognize a position pointed to by the pointing object, and a second operational configuration that irradiates light from the light-emitting devices and detects, with the light-receiving devices, light reflected by the pointing object to recognize a position pointed to by the pointing object in a period in which the display portion is in a non-display state, wherein the period in which the display portion is in the non-display state is provided between images of sequential frames, and wherein the display apparatus recognizes a position pointed by the pointing object not in contact with the display portion.

2. The display apparatus according to claim 1, wherein the first operational configuration and the second operational configuration are switched in accordance with intensity of a light detected with the light-receiving devices when the light-emitting devices irradiate no light.

3. The display apparatus according to claim 1, wherein light irradiated from the light-emitting devices is infrared light.

4. The display apparatus according to claim 1, wherein in the first operational configuration, a second region that is surrounded by a first region provided with the light-receiving devices detecting light with intensity higher than or equal to a first intensity and that is provided with the light-receiving devices detecting light with intensity lower than the first intensity and vicinity of the second region is recognized as a position pointed to by the pointing object.

5. The display apparatus according to claim 1, wherein in the second operational configuration, a fourth region that is surrounded by a third region provided with the light-receiving devices detecting light with intensity lower than or equal to a second intensity and that is provided with the light-receiving devices detecting light with intensity higher than the second intensity and vicinity of the fourth region is recognized as a position pointed to by the pointing object.

6. The display apparatus according to claim 1, wherein the light-receiving devices comprise a photoelectric conversion layer and comprise an organic compound in the photoelectric conversion layer.

7. The display apparatus according to claim 1,
wherein the display portion comprises a display device, and
wherein the display device emits any of red light, green light, blue light, and white light.

8. The display apparatus according to claim 7, wherein in the second operational configuration, the light-receiving devices detect light when the display device emits no light.

9. The display apparatus according to claim 7, wherein the display device and the light-receiving devices each comprise a diode structure and a cathode of the display device and an anode of the light-receiving devices are electrically connected to each other.

10. The display apparatus according to claim 7, wherein the display device and the light-receiving devices each comprise a diode structure and a cathode of the display device and a cathode of the light-receiving devices are electrically connected to each other.

11. The display apparatus according to claim 7,
wherein the display device and the light-receiving devices are electrically connected to a plurality of transistors,
wherein one or more of the plurality of transistors comprises a metal oxide in a channel formation region,
wherein the metal oxide comprises In, Zn, and M, and
wherein M is Al, Ti, Ga, Ge, Sn, Y, Zr, La, Ce, Nd, or Hf.

12. An electronic device comprising the display apparatus according to claim 1 and an optical sensor, wherein the electronic device switches operation for detecting a position pointed to by the pointing object in accordance with intensity of light detected by the optical sensor.

* * * * *